United States Patent
Moriya et al.

(10) Patent No.: US 10,634,313 B2
(45) Date of Patent: Apr. 28, 2020

(54) LIGHT-EMITTING DEVICE, AUTHENTICATION NOTIFICATION SYSTEM, AND DOOR

(71) Applicant: SHARP KABUSHIKI KAISHA, Sakai, Osaka (JP)

(72) Inventors: Masaaki Moriya, Sakai (JP); Masafumi Ueno, Sakai (JP); Naoki Shiobara, Sakai (JP); Mitsuru Hineno, Sakai (JP); Tomohiro Omatsu, Sakai (JP); Hiroyuki Furukawa, Sakai (JP); Yasuhiro Sugita, Sakai (JP); Shinji Yamagishi, Sakai (JP); Jean Mugiraneza, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/306,569

(22) PCT Filed: Mar. 27, 2017

(86) PCT No.: PCT/JP2017/012466
§ 371 (c)(1),
(2) Date: Dec. 1, 2018

(87) PCT Pub. No.: WO2017/212745
PCT Pub. Date: Dec. 14, 2017

(65) Prior Publication Data
US 2019/0323683 A1    Oct. 24, 2019

(30) Foreign Application Priority Data

Jun. 8, 2016    (JP) .................................. 2016-114841

(51) Int. Cl.
*F21V 9/00*    (2018.01)
*F21V 21/00*    (2006.01)
(Continued)

(52) U.S. Cl.
CPC ................ *F21V 9/00* (2013.01); *F21V 21/00* (2013.01); *H01L 33/58* (2013.01); *H01Q 1/243* (2013.01);
(Continued)

(58) Field of Classification Search
None
See application file for complete search history.

(56) References Cited

U.S. PATENT DOCUMENTS

| | | | |
|---|---|---|---|
| 2009/0051620 | A1 | 2/2009 | Ishibashi et al. |
| 2009/0140938 | A1 | 6/2009 | Ishibashi et al. |

(Continued)

FOREIGN PATENT DOCUMENTS

| | | |
|---|---|---|
| JP | 2006-195802 A | 7/2006 |
| JP | 2007-328579 A | 12/2007 |

(Continued)

*Primary Examiner* — Elmito Breval
(74) *Attorney, Agent, or Firm* — ScienBiziP, P.C.

(57) ABSTRACT

Provided is a light-emitting device and the like in which a light source emits light on the basis of information obtained through communications and the light thus emitted is easy for a user to visually recognize. A light-emitting device includes an LED, a light guide plate, a transparent NFC antenna sheet, and an NFC antenna. The transparent NFC antenna sheet and the NFC antenna are disposed on a principal surface or a backside surface of the light guide plate. At least some part of the light guided by the light guide plate exits out through the principal surface. The LED emits light on the basis of identification information obtained through communications via the NFC antenna sheet and the NFC antenna.

16 Claims, 14 Drawing Sheets

(51) Int. Cl.
*H01L 33/58* (2010.01)
*H01Q 1/24* (2006.01)
*H04B 5/00* (2006.01)

(52) U.S. Cl.
CPC ......... *H04B 5/0031* (2013.01); *H04B 5/0056* (2013.01)

(56) References Cited

U.S. PATENT DOCUMENTS

2013/0316664 A1* 11/2013 Kim .................. H04N 9/30 455/90.1
2015/0185928 A1* 7/2015 Son .................. G06F 3/016 345/174

FOREIGN PATENT DOCUMENTS

JP 2010-032288 A 2/2010
WO 2006/106982 A1 10/2006

* cited by examiner (FRONT VIEW)

(SIDE VIEW)

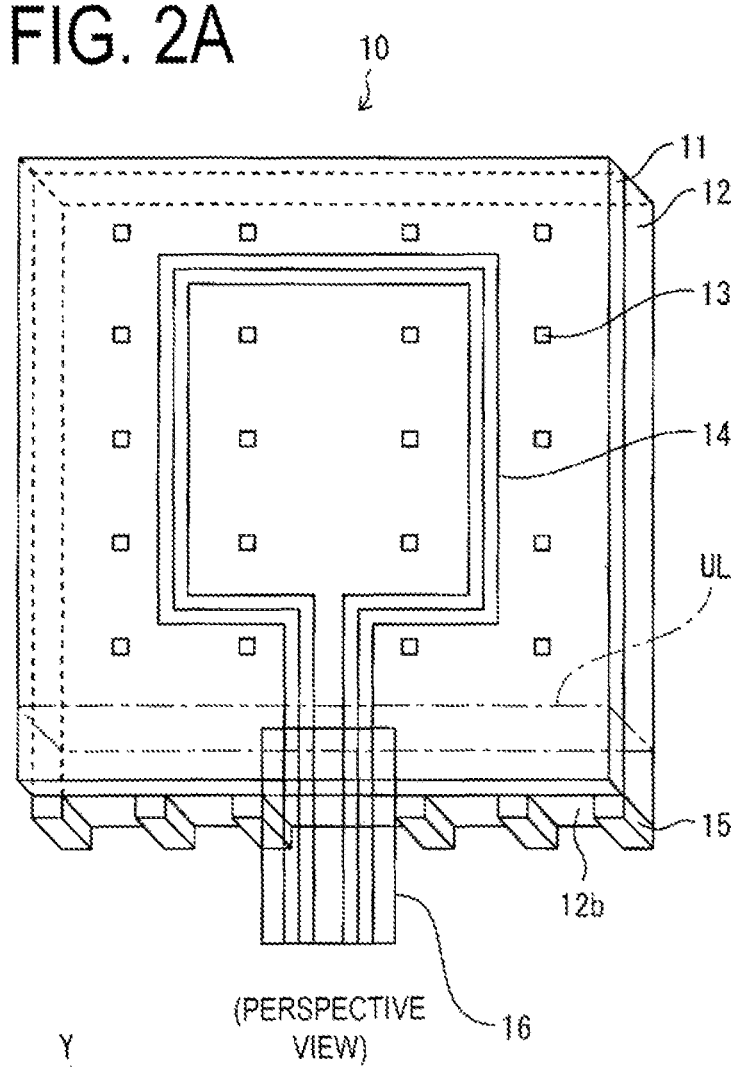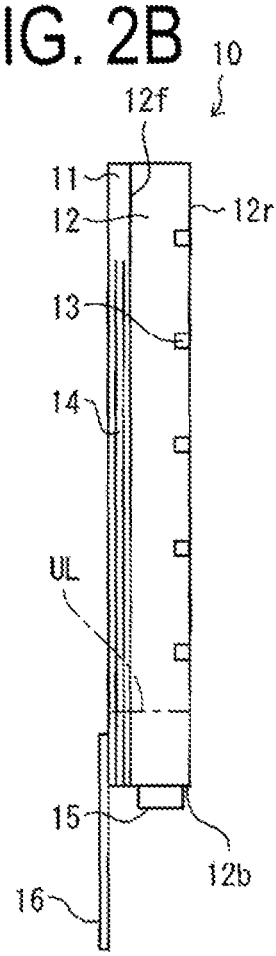
FIG. 2A
FIG. 2B
(PERSPECTIVE VIEW)
(SIDE VIEW)

FIG. 6A
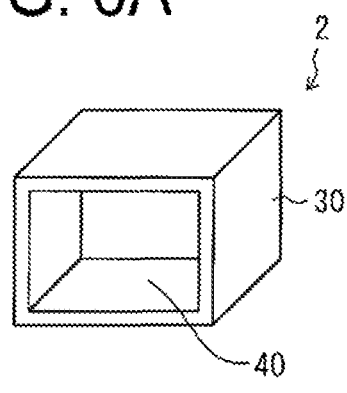
DOOR IS IN A CLOSED STATE
FIG. 6B
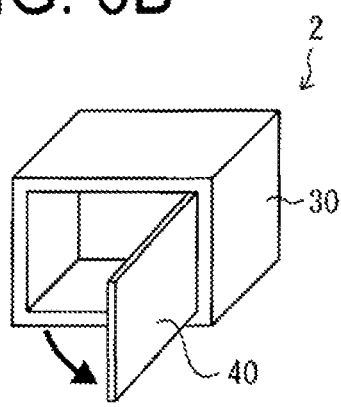
DOOR IS IN AN OPEN STATE
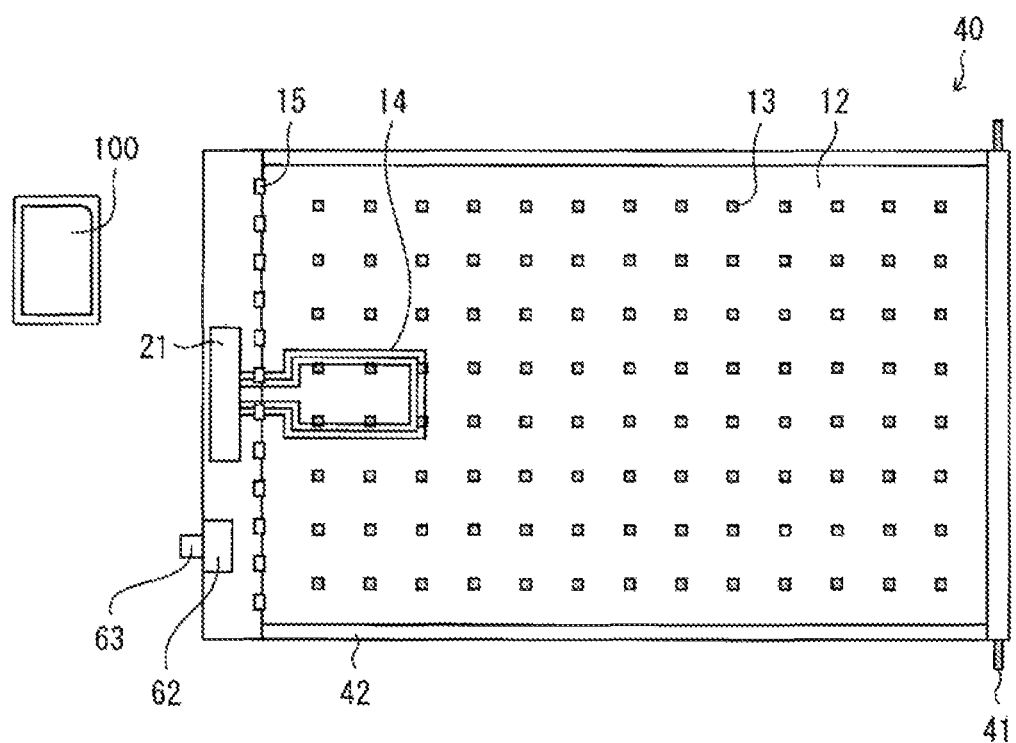
FIG. 7

FIG. 10A
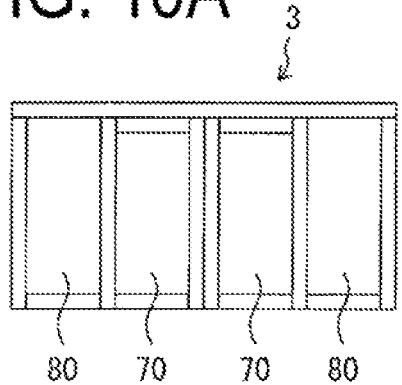
DOOR IS IN A CLOSED STATE
FIG. 10B
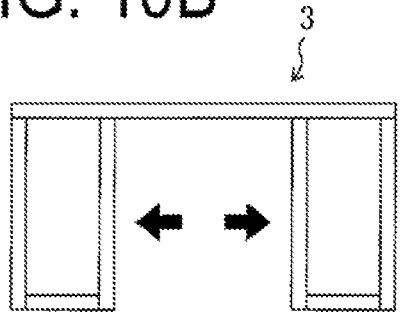
DOOR IS IN AN OPEN STATE
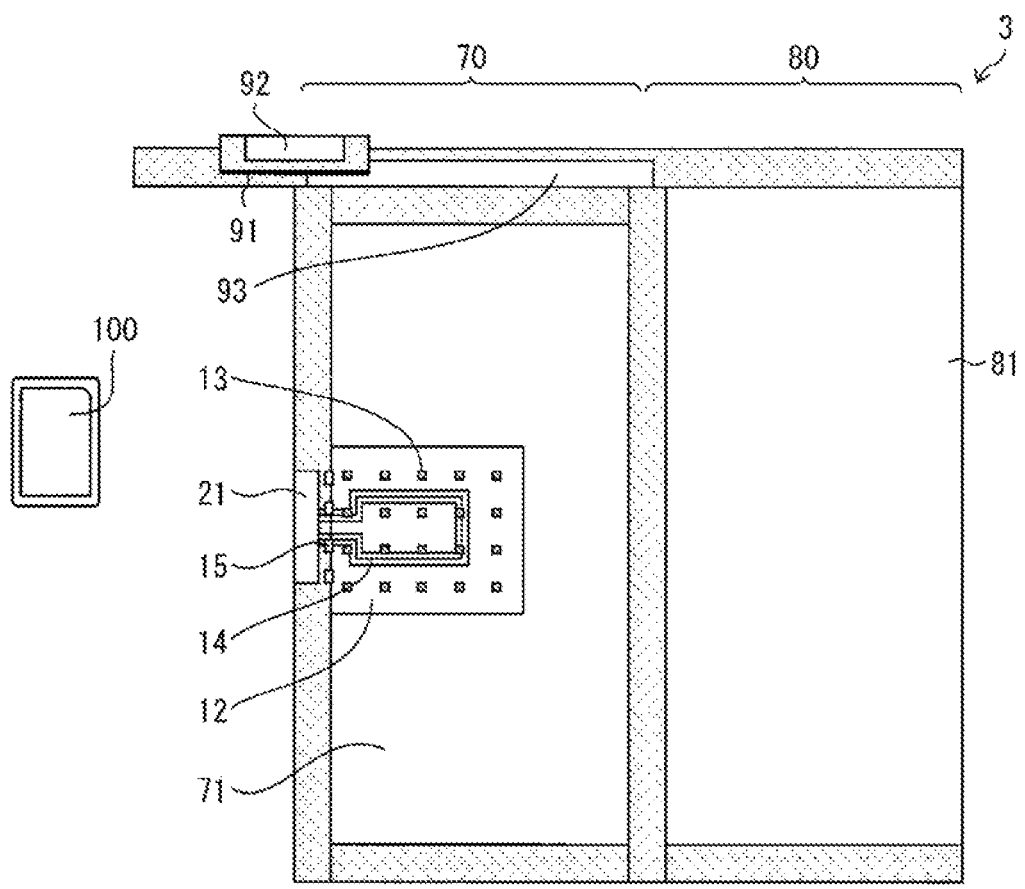
FIG. 11

(PERSPECTIVE VIEW)

(SIDE VIEW)

LIGHT-EMITTING DEVICE, AUTHENTICATION NOTIFICATION SYSTEM, AND DOOR

TECHNICAL FIELD

The disclosure relates to a light-emitting device equipped with a light source, and in particular it relates to a light-emitting device used for making notification to a user.

BACKGROUND

PTL1 discloses an object detection device configured to detect an object by detecting the electromagnetic wave intensity received by a transparent antenna part provided in a transparent glass plate.

PTL2 discloses a transparent antenna for a display including an antenna pattern formed on a surface of a sheet-like transparent material.

CITATION LIST

Patent Literature

PTL1: JP 2010-32288 A (filed on Feb. 12, 2010)
PTL2: WO 2006/106982 (filed on Oct. 12, 2006)

SUMMARY

Technical Problem

An object of the following disclosure is to provide a light-emitting device allowing a user to visually recognize with ease light emission of a light source configured to emit light on the basis of information obtained through communications and also provide an authentication notification system equipped with such a light-emitting device.

Solution to Problem

To achieve the objective, a light-emitting device according to an aspect of the present invention includes a light source, a light guide configured to guide light emitted from the light source, an antenna layer having transparency, and provided on a first surface of the light guide, the first surface being a principal surface of the light guide, or provided on a second surface that is opposite to the first surface. In the light-emitting device, at least a part of the light guided by the light guide exits out through the first surface, and the light source is configured to emit light on the basis of information obtained through communications via the antenna layer.

Advantageous Effects of Invention

According to an aspect of the present invention, advantageous effects can be achieved that allow a user to visually recognize with ease light emission of a light source configured to emit light on the basis of information obtained through communications.

BRIEF DESCRIPTION OF DRAWINGS

FIG. 1A is a front view, and FIG. 1B is a side view.

FIGS. 2A and 2B are drawings illustrating a configuration of a transparent panel of the first embodiment. FIG. 2A is a perspective view, and FIG. 2B is a side view.

FIGS. 6A and 6B illustrate drawings illustrating external appearances of a showcase of a second embodiment. FIG. 6A illustrates a state where a swing door is closed, and FIG. 6B illustrates a state where the swing door is opened.

FIG. 7 is a drawing illustrating a structure of a swing door.

FIGS. 10A and 10B illustrate drawings illustrating external appearances of an automatic door system of a third embodiment. FIG. 10A illustrates a state where an automatic door is closed, and FIG. 10B illustrates a state where an automatic door is opened.

FIG. 11 is a drawing illustrating a structure of an automatic door.

FIG. 15A is a perspective view, and FIG. 15B is a side view.

DESCRIPTION OF EMBODIMENTS

First Embodiment

Hereinafter, the first embodiment according to an aspect of the present invention will be described with reference to FIG. 1A to FIG. 5. A light-emitting device 1 of the present embodiment may be used as a toy, for instance.

Configuration of Light-Emitting Device 1

Figure 1A:
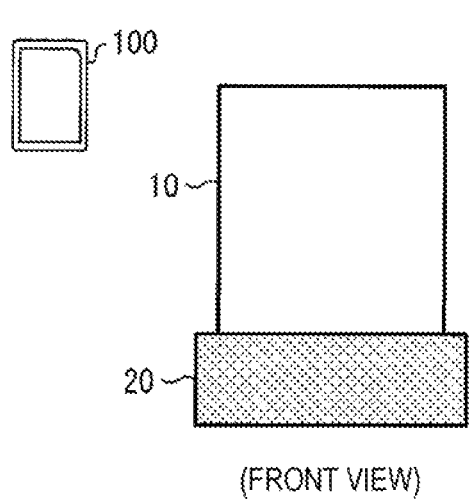
FIGS. 1A and 1B are drawings illustrating external appearances of a light-emitting device of a first embodiment.
Figure 1B:
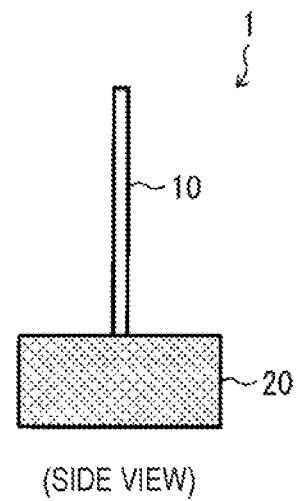
Figure 3:
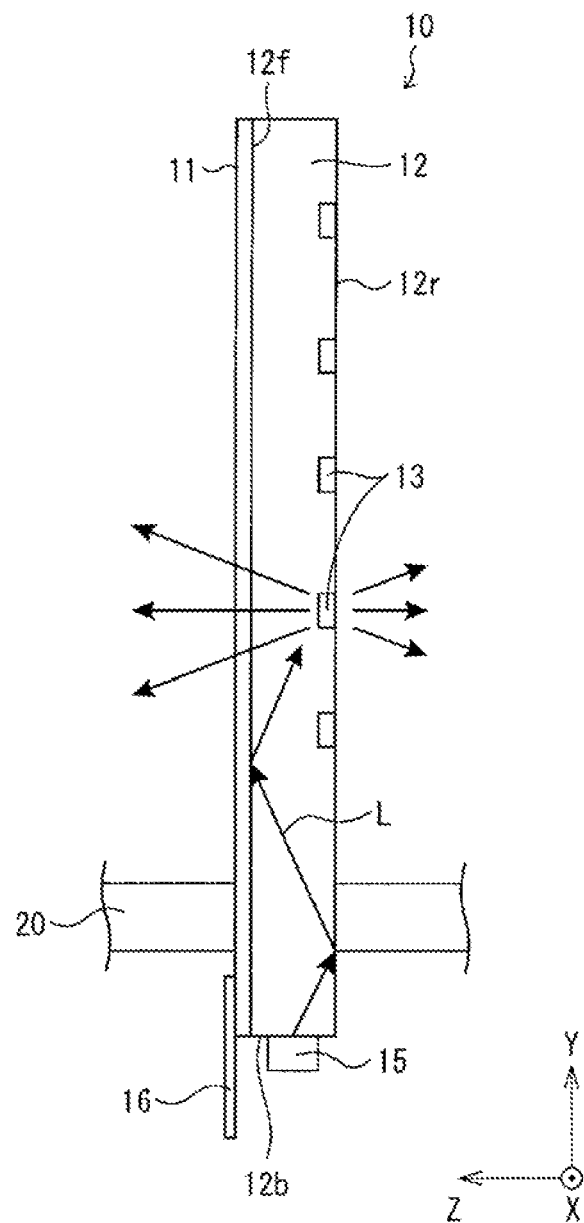
FIG. 3 is a cross-sectional view illustrating light propagation paths in a light guide plate.

To begin with, a configuration of the light-emitting device 1 will be described with reference to FIG. 1A to FIG. 3. FIGS. 1A and 1B are drawings illustrating external appearances of the light-emitting device 1 of the present embodiment. FIG. 1A is a front view, and FIG. 1B is a side view. FIGS. 2A and 2B are drawings illustrating a configuration of a transparent panel 10 of the present embodiment. FIG. 2A is a perspective view, and FIG. 2B is a side view. FIG. 3 is a cross-sectional view illustrating propagation paths for light L in a light guide plate 12 (light guide).

As illustrated in FIG. 1A and FIG. 1B, the light-emitting device 1 includes the transparent panel 10 and a base 20. The transparent panel 10 is a transparent plate-shaped member, and is inserted, in a substantially perpendicular manner, into a top surface of the base 20 having a box-shaped casing. The transparent panel 10 includes a Near Field Radio Communication (NFC) antenna 14 (see FIGS. 2A and 2B), and the base 20 accommodates a control board 21 (see FIG. 4) and the like. Hence, in a case where an NFC card 100 with prescribed information stored therein comes closer to the transparent panel 10, the control board 21 and the like conduct processes based on the prescribed information obtained through communications (NFC communications) via the NFC antenna 14. A specific configuration of the base 20 will be described later.

Note that the description in the present embodiment assumes that the object to be held over the NFC antenna 14 is the NFC card 100, but the object may be some other things than a card. Specifically, the object may be a terminal device equipped with a built-in NFC antenna 14 (e.g., a portable digital assistant such as a portable multi-functional telephone (smart phone)). The NFC card 100 and the above-mentioned device may be referred to as NFC terminals.

As illustrated in FIG. 2A and FIG. 2B, the transparent panel 10 includes an NFC antenna sheet 11, a light guide plate 12 (light guide), a recess 13 serving as an optical diffuser, the NFC antenna 14, a Light Emitting Diode (LED) 15, and a flexible board 16. The light guide plate 12, the NFC antenna 14, and the LED 15 together forms a basic configuration of the light-emitting device 1.

The NFC antenna sheet 11 is a sheet configured to cover and protect the NFC antenna 14 on a principal surface (first surface) 12$f$ of the light guide plate 12. In addition, the NFC antenna sheet 11 is a transparent sheet. The NFC antenna sheet 11 may be made from a synthetic resin with a high optical transparency. Examples of the materials include: methacrylic resins, polycarbonate resins, polyester resins (e.g., polyethylene terephthalate), vinyl chloride resins, cellulose resins (e.g., triacetylcellulose), rubber resins, polyurethane resins, and polyvinyl acetate resins. In addition, some copolymers may be used, such as vinyl chloride-vinyl acetate copolymer resins and ethylene-vinyl acetate copolymer resins.

In the present embodiment, the NFC antenna 14 is attached to the NFC antenna sheet 11, and the NFC antenna sheet 11 with the NFC antenna 14 attached thereto is attached to the principal surface 12$f$ of the light guide plate 12. Alternatively, the NFC antenna 14 may firstly be disposed on the principal surface 12$f$ of the light guide plate 12, and then the NFC antenna sheet 11 may be attached to the light guide plate 12 over the NFC antenna 14 to cover the NFC antenna 14. Still alternatively, the NFC antenna 14 may be built inside the NFC antenna sheet 11.

The light guide plate 12 guides the light L emitted from the LED IS. In addition, the light guide plate 12 is transparent. Specifically, the light guide plate 12 has certain transparency so that the light that comes from outside and enters through a backside surface (second surface) 12$r$ is allowed to go out through the principal surface (first surface) 12$f$. In addition, the transparency may be such that the light that comes from outside and enters through the principal surface (first surface) 12$f$ is allowed to go out through the backside surface (second surface) 12$r$. The light guide plate 12 may be transparent or may be semitransparent.

Like the NFC antenna sheet 11, the light guide plate 12 may be made from a synthetic resin with a high optical transparency. Examples of the materials include: methacrylic resins, polycarbonate resins, polyester resins (e.g., polyethylene terephthalate), vinyl chloride resins, and cellulose resins (e.g., triacetylcellulose).

In addition, the shapes of the principal surface 12$f$ and the backside surface 12$r$ of the light guide plate 12 are not necessarily quadrilateral. The shapes may be triangles or polygons with five or more sides. Alternatively, circles or other shapes may also be employed. In addition, the light guide plate 12 is not necessarily a flat plate but may be curved.

As illustrated in FIGS. 2A to 3, the light guide plate 12 includes the recess 13 formed in the backside surface 12$r$, which is the opposite surface to the principal surface 12$f$. The principal surface 12$f$ is a surface that is used principally to allow the light L emitted from the LED 15 and guided to exit to the outside. As illustrated in FIG. 3, when the LED 15 lights up, the recess 13 carries out light-distribution control (orientation control) on the light L having been emitted from the LED 15.

Specifically, as illustrated in FIG. 3, when the LED 15 lights up, the light L having been emitted from the LED 15 disposed on a bottom surface 12$b$ of the light guide plate 12 is totally reflected inside of the light guide plate 12, and travels spreading upwards (in the y direction). The light L having entered the recess 13 is diffused by the recess 13, and is then allowed to go out of the light guide plate 12. At least some part of the light L that has been guided by the light guide plate 12 is allowed to exit out of the light guide plate 12 through the principal surface 12$f$. In this way, the recess 13 functions as an optical member configured to alter the propagation direction of the light L having been emitted from the LEI) 15 and allow the light L to exit from the light guide plate 12.

In the present embodiment, as illustrated in FIG. 2A, a plurality of recesses 13 having substantially identical shapes are formed in the backside surface 12$r$, and form a prescribed pattern (so-called, a dot pattern).

Note that any optical member having the above-described functions may be used as the recess 13. The shape of the optical member may be a triangular pole (prism) shape, a quadrangular pyramid shape, a truncated quadrangular pyramid shape, or the like.

Alternatively, the optical member may have a protrusion shape that protrudes from the backside surface 12$r$. The optical members of protrusion shapes may be formed by silk-printing a dot pattern. Alternatively, the light-diffusing function may be given to a surface of the light guide plate 12 by making laser waves form marks in the surface of the light guide plate 12. In addition, it is not necessary for the optical member to have only flat surfaces. A part or the entire part of all the surfaces may be curved.

In addition, the state of the light L exiting from the light guide plate 12 when the LED 15 lights up may be altered by altering appropriately the shape or the position of the recess 13 or by altering appropriately the shapes or the positions of the dots in the dot pattern. In the present embodiment, as illustrated in FIG. 3, the shape or the position of the recess 13, or the shapes or the positions of the dots in the dot pattern are defined so that the total flux of the light L (i.e., the intensity of the light L) exiting from the principal surface 12$f$ is greater than the total flux of the light exiting from the backside surface 12$r$. To be more specific, in the present embodiment, the shape or the position is defined so that the light L having been emitted from the LED 15 exits mainly through the principal surface 12$f$ (i.e., it hardly exits through the backside surface 12$r$). To put it differently, in the present embodiment, the shape or the position is defined so that the light L emitted from the LED 15 exits substantially evenly through the entire principal surface 12$f$ (excluding the lower portion of the principal surface 12$f$ below the line UL illustrated in FIGS. 2A and 2B because that portion is inserted in the base 20).

Note that the shape or the position may be defined so that the light L exiting through the principal surface 12$f$ forms a certain specific light-emission pattern. Alternatively, the shape or the position may be defined so that the light L emitted from the LED 15 exits through the backside surface 12r, as well. For instance, 80% of the light L may exit through the principal surface 12f, and 20% of the light L may exit through the backside surface 12r. Alternatively, 50% of the light L may exit through the principal surface 12f, and 50% of the light L may exit through the backside surface 12r. This means that approximately the same amount of light L may exist from the light guide plate 12 through the principal surface 12f and through the backside surface 12r. In addition, the transparency of the light guide plate 12 may be altered by appropriately changing the density of the formed recesses 13 and the sizes of the individual recesses 13. As such, the shape or the size of each recess 13, or the position of each recess 13 in the light guide plate 12 may be changed appropriately to make the light-emitting device 1 more suitable for its use.

The NFC antenna 14 is a transparent antenna with certain transparency. The NFC antenna sheet 11 is used to attach the NFC antenna 14 to the principal surface 12f of the light guide plate 12. Thus, the NFC antenna is disposed on the principal surface 12f. To put it differently, the NFC antenna 14, together with the NFC antenna sheet 11, forms a transparent antenna layer. When the NFC card 100 is brought to the proximity of the NFC antenna 14, the NFC antenna 14 either wirelessly reads the information recorded in the NFC card 100 or wirelessly sends the information stored in the light-emitting device 1 to the NFC card 100.

In the present embodiment, the NFC antenna 14 is formed of a mesh structure (lattice structure, net-like structure) made of metal wires with an approximately 5-μm diameter. The mesh structure is formed into the shape illustrated in FIG. 2A to finish the NFC antenna 14. As such, the NFC antenna 14 is made of very fine metal wires. Hence, in a case where a user views the NFC antenna 14 from the side of the principal surface 12f of the light guide plate 12, the space located on the opposite side (i.e., the external space that faces the backside surface 12r) can be seen through the NFC antenna 14. Hence, the NFC antenna 14 is a transparent antenna that is difficult for a user to visually recognize the presence of the antenna. Note that in FIGS. 2A and 2B, the NFC antenna 14 is illustrated with solid lines to clearly indicate the position where the NFC antenna 14 is disposed.

The following describes an example of a method of manufacturing the NFC antenna 14. To begin with, a metal material, such as copper foil or silver foil, is attached on a surface of the NFC antenna sheet 11. Then, a mask with a mesh-structure pattern and an electrode wiring line pattern formed thereon is transferred onto the metal material. After that, an etching process is carried out to leave the patterns on the surface of the NFC antenna sheet 11, and thus the mesh-structure NFC antenna 14 is formed in a state where the mesh-structure NFC antenna 14 is attached to the surface of the NFC antenna sheet 11. In addition to the above-mentioned copper foil or the silver foil, a film of gold, platinum, tin, aluminum, iron, nickel, or an alloy thereof may be used as the metal material.

Alternatively, the NFC antenna 14 may include a transparent electrically-conductive material such as Indium Tin Oxide (ITO). In this case, the NFC antenna 14 does not have to include the above-described mesh structure formed therein.

The LED 15 is a light source configured to emit the light L, and thus is disposed in a vicinity of at least one side of the light guide plate 12. In the example illustrated in FIGS. 2A and 2B, the LED 15 is disposed on the bottom surface 12b of the light guide plate 12. Note that none of the wiring line connected to the LED 15 is illustrated in the drawing for the sake of simpler description.

The line UL illustrated in FIGS. 2A and 2B indicates the position at which the top surface of the base 20 is fixed when the transparent panel 10 is mounted on the base 20. Hence, the LED 15 attached to the bottom surface 12b is buried in the base 20 when the transparent panel 10 is mounted on the base 20. As a result, the light guide plate 12 is the only portion that the user can visually recognize as the light-emitting portion. Accordingly, the light-emitting device 1 with an excellent design may be provided. In a case where this advantage is considered not important, the LED 15 does not have to be attached on the bottom surface 12b. To put it differently, the LED 15 may be attached to the light guide plate 12 in any fashion as long as the light L having been emitted from the LED 15 is guided inside of the light guide plate 12.

In addition, in the light guide plate 12, the portion other than the one buried in the base 20 (the portion above the line UL in FIGS. 2A and 2B) is open to the external space (i.e., is in contact with the external space). To put it differently, in the light guide plate 12, at least a portion of the principal surface 12f and at least a portion of the backside surface 12r are open to the external space. This allows the user to visually recognize light emission of the principal surface 12f. In addition, with a configuration that allows the light L having been emitted from the LED 15 to exit through the backside surface 12r, the user can visually recognize the light emission of the backside surface 12r.

The light L emitted from the LED 15 may be any visible light (within a wavelength range from 400 nm to 780 nm). For instance, the light L may be white light, but the color of the light is not limited to any particular one(s).

In addition, as illustrated in FIG. 2A, a plurality of LEDs 15 are disposed on the bottom surface 12b of the light guide plate 12. An LED bar where a plurality of LEDs are arranged on a common board may be attached to the bottom surface 12b. Alternatively, individual LED boards may be arranged on the bottom surface 12b. In addition, different kinds of LEDs 15 emitting lights with different wavelengths from each other may be used in combination with one another.

Light sources other than LEDs may also be used. For instance, a combination of a semiconductor laser and a fluorescent body may be used as the light sources.

The flexible board 16 is attached to a lower side of the light guide plate 12, and the wiring line of the lower portion of the NFC antenna 14 is connected to the flexible board 16. Hence, in a state where the transparent panel 10 is mounted on the base 20, the NFC antenna 14 and the control board 21 (see FIG. 4) disposed in the base 20 are electrically connected to each other.

Specific Configuration of Light-Emitting Device 1

Figure 4:
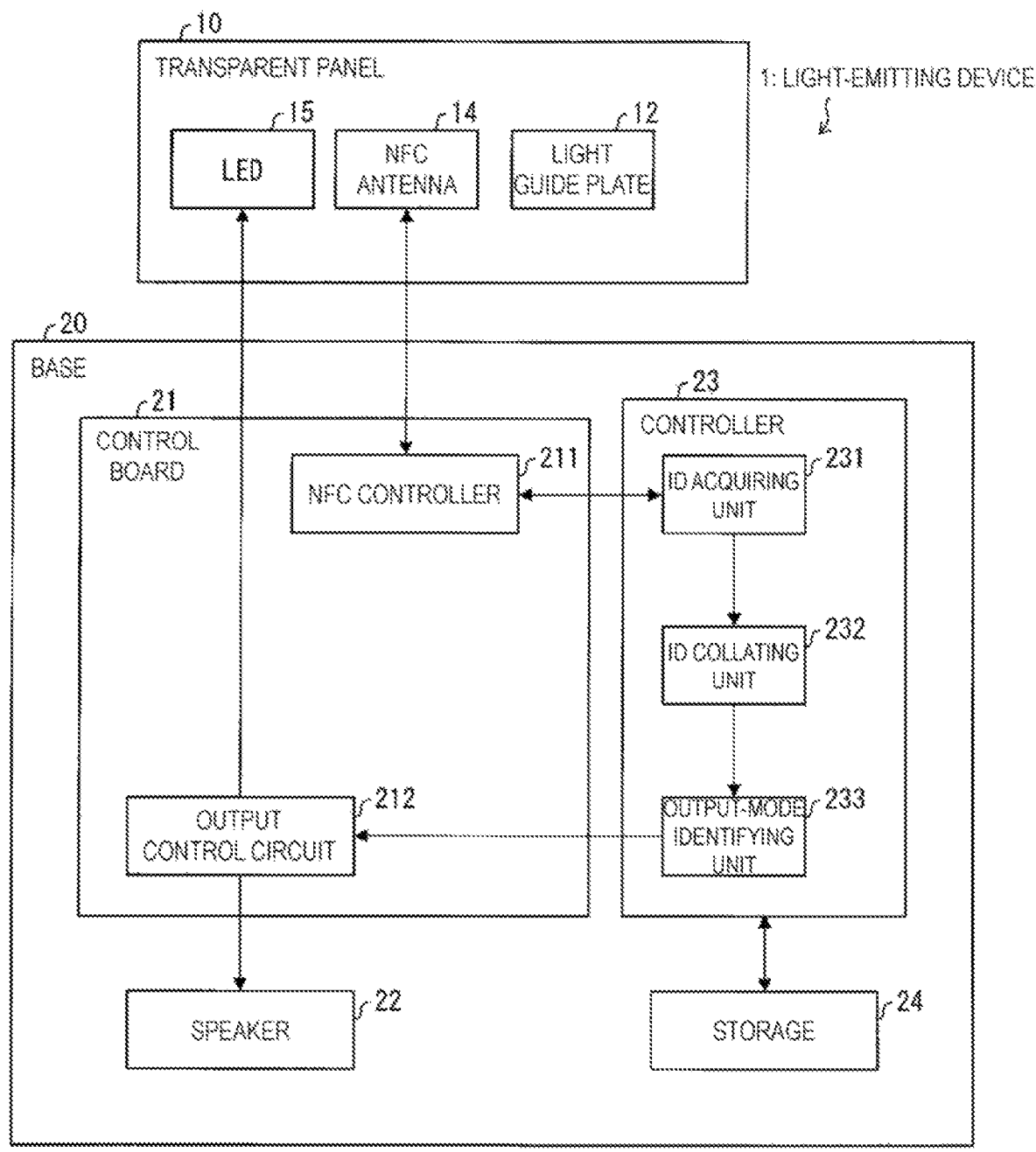
FIG. 4 is a drawing illustrating a specific configuration of a light-emitting device of the first embodiment.

Next, a specific configuration of the light-emitting device 1 will be described with reference to FIG. 4. FIG. 4 is a drawing illustrating a specific configuration of the light-emitting device 1 of the present embodiment. As the transparent panel 10 has already been described earlier, a specific configuration of the base 20 will be described below.

As illustrated in FIG. 4, the base 20 includes the control board 21, a speaker 22, a controller 23, and a storage 24.

The control board 21 is a board for controlling the NFC antenna 14, and includes an NFC controller 211 and an output control circuit 212.

The NFC controller 211 performs a drive control of the NFC antenna 14 on the basis of a control signal from the controller 23. Specifically, the NFC controller 211 regularly changes a magnetic field created by the NFC antenna 14 to carry out a polling for checking whether there is an NFC card 100 (see FIGS. 1A and 1B) around the NFC antenna 14.

Specifically, an IC chip and a coil are provided in the NFC card 100. When the NFC card 100 is held over the NFC antenna 14, the magnetic field created by the NFC antenna 14 is changed by the polling, and thus an induced current is generated in the coil of the NFC card 100. The induced current activates the IC chip. Then, the NFC controller 211 wirelessly exchanges information between the NFC antenna 14 and the IC chip. In addition, the NFC controller 211 sends, to the controller 23, the information having been received wirelessly from the IC chip.

Hence, the NFC controller 211 functions as a reader/writer chip (R/W chip) configured to read the information recorded in the NFC card 100 and to write, into the NFC card 100, the information stored in the storage 24. Note that in the present embodiment, the NFC controller 211 has only to have the function of reading information from the NFC card 100. It is not necessary for the NFC controller 211 to have a function of writing information into the NFC card 100.

In the present embodiment, the NFC card 100 has identification information recorded therein. The identification information may be information unique to individual NFC cards and for identifying the NFC card 100 (terminal device information) (or the identification information may be information unique to individual users and for identifying the user who owns the NFC card 100). In a case where the NFC card 100 is around the transparent panel 10, the NFC controller 211 reads out the identification information from the NFC card 100.

In the present embodiment, information indicating the blood type of the user who owns the NFC card 100 is recorded in the NEC card 100 as the identification information.

The output control circuit 212 is a circuit configured to perform: (1) control of the lighting-up of the LED 15; and (2) control of the output of the speaker 22, on the basis of the control signal from the controller 23 (LED lighting-up information and audio information, both of which will be described later). Hence, the LEI) 15 lights up or goes out, and the speaker 22 outputs sounds in accordance with the control performed by the output control circuit 212.

The controller 23 is configured to integrally control the control board 21 and to perform activation or control of software programs (applications) stored in the storage 24 in response to the operation by the user. For instance, the controller 23 performs: (1) control of the driving of the NFC antenna 14 in accordance with the software; (2) acquiring of the identification information of the NFC card 100 through the communications with the NFC card 100; and (3) transmission of information to the NFC card 100 through the communications. In the cases of some kinds of software, the controller 23 performs user authentication (personal authentication) of the user who owns the NFC card 100, and performs settlement for the user, or the like. The controller 23 is in connection with the NFC controller 211 and the output control circuit 212 in a communicable manner.

The storage 24 stores, for instance, various kinds of control programs and the like to be executed by the controller 23. Some examples of the storage 24 include a hard disk drive and nonvolatile storage devices such as a flash memory. In the present embodiment, the storage 24 stores, as the above-mentioned software programs, a software program for carrying out fortune-telling by blood types. The storage 24 also stores, for instance: (1) modes of light emission by the LED 15 corresponding to individual blood types; (2) a mode of light emission by the LED 15 to be employed in case of failing to acquire any identification information indicating a blood type; and (3) audio information to be used as a result of fortune-telling.

Specific Configuration of Controller 23

The controller 23 includes functional parts of implementing the activation, the control, or the like of the software program, such as, an Identification (ID) acquiring unit 231, an ID collating unit 232, and an output-mode identifying unit 233.

The ID acquiring unit 231 acquires the identification information stored in the NFC card 100 (i.e., the identification information indicating the blood type of the user who owns the NFC card 100). Specifically, the ID acquiring unit 231 acquires, from the NFC controller 211, the identification information having been read out from the NFC card 100 by the NFC controller 211 when the NFC card 100 is around the NFC antenna 14. The ID acquiring unit 231 sends the identification information thus acquired to the ID collating unit 232.

Once the ID collating unit 232 receives the identification information via the NFC antenna 14, the ID collating unit 232 collates the identification information with the identification information stored in the storage 24 (registered ID), and sends the collation result to the output-mode identifying unit 233. Hence, the ID collating unit 232 functions as the authentication circuitry configured to carry out authentication by use of the identification information received via the NFC antenna 14.

Specifically, the ID collating unit 232 identifies the blood type indicated by the identification information acquired from the ID acquiring unit 231, and determines whether or not the storage 24 stores any identification information indicating the same blood type as the blood type identified above. When the ID collating unit 232 determines that the two pieces of identification information indicate the same blood type, the ID collating unit 232 performs fortune-telling, and then sends, to the output-mode identifying unit 233, the acquired identification information and the result of the fortune-telling. In contrast, in a case where the ID collating unit 232 determines that the two pieces of identification information do not indicate the same blood type, the ID collating unit 232 sends, to the output-mode identifying unit 233, a message indicating that the two pieces of information did not indicate the same blood type.

The output-mode identifying unit 233 identifies the mode of light emission by the LED 15 on the basis of the collation result sent from the ID collating unit 232.

Specifically, when the two pieces of identification information indicate the same blood type, the output-mode identifying unit 233 refers to the storage 24 and thus identifies a light-emission mode corresponding to the blood type indicated by the identification information. Then, the output-mode identifying unit 233 sends, to the output control circuit 212, LED lighting-up information indicating the identified light-emission mode and the received result of fortune-telling. The output control circuit 212 controls the LED 15 in accordance with the light-emission mode indicated by the received LED lighting-up information (i.e., the color and the flickering pattern of the light L emitted from the LED 15 indicated by the LED lighting-up information), and causes the speaker 22 to output audio information indicating the received fortune-telling result.

In contrast, when the two pieces of identification information indicate the same blood type, the output-mode identifying unit 233 refers to the storage 24 and identifies the light-emission mode of the LED 15 for the case where no identification information indicating any blood type is acquired. Then, the output-mode identifying unit 233 sends, to the output control circuit 212, LED lighting-up information indicating the identified light-emission mode. The output control circuit 212 performs a lighting-up control of the LED 15 in accordance with the light-emission mode indicated by the received LED lighting-up information.

As such, by the processing performed by the control board 21 and the controller 23, the LED 15 emits light on the basis of the information obtained through the communications via the NFC antenna 14 (i.e., on the basis of the identification information recorded in the NFC card 100).

Note that in the description above, the LED lighting-up information corresponds to the identification information recorded in the NFC card 100, but that the LED lighting-up information is not limited to this. Instead, the LED lighting-up information may correspond to the fortune-telling result. In this case, the light-emission state of the LED 15 may be altered in accordance with the fortune-telling result.

Processes Performed in Light-Emitting Device 1

Figure 5:
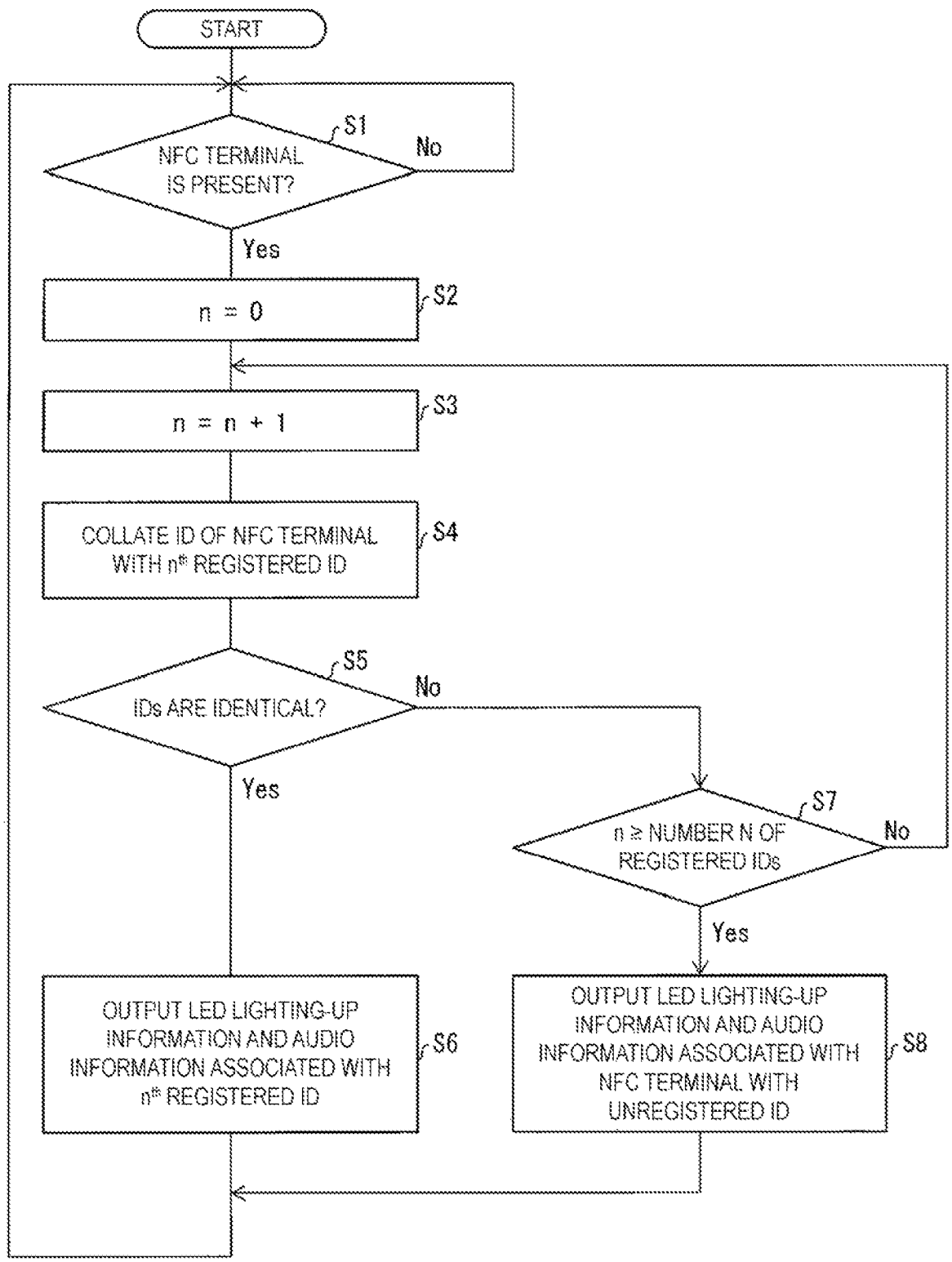
FIG. 5 is a flow chart illustrating a flow of processes performed in a light-emitting device of the first embodiment.

Next, a flow of processes performed in the light-emitting device 1 of the present embodiment will be described below with reference to FIG. 5. FIG. 5 is a flow chart illustrating a flow of processes performed in the light-emitting device 1 of the present embodiment.

To begin with, the NFC controller 211 carries out a polling to determine whether or not there is an NFC card 100 (see FIGS. 1A and 1B) around the NFC antenna 14 (S1). In a case where the NFC controller 211 determines that there is an NFC card 100 around the NFC antenna 14 (YES in S1), the NFC controller 211 reads out the identification information from the NFC card 100. The ID acquiring unit 231 acquires the identification information having been read out by the NFC controller 211 and sends the acquired identification information to the ID collating unit 232.

The ID collating unit 232 initializes the set number n indicating the identification information (S2), increments the number n by one, and sets a new number n indicating the identification information (S3). Then, the ID collating unit 232 collates the identification information (ID) recorded in the NFC card 100 (a kind of NFC terminal) with the identification information stored in the storage 24 (the registered (nh) ID of the number n set in S3) (S4), and determines whether or not the two pieces of identification information are identical to each other (S5).

In a case where the two pieces of identification information are identical to each other (YES in S5), the ID collating unit 232 performs fortune-telling and sends, to the output-mode identifying unit 233, the collation result including the identification information stored in the storage 24 and the fortune-telling result. In this case, the output-mode identifying unit 233 sends, to the output control circuit 212, the LED lighting-up information indicating the light-emission mode of the LED 15 corresponding to the identification information stored in the storage 24 and the audio information indicating the fortune-telling result. Hence, the LED 15 emits light corresponding to the blood type indicated by the identification information recorded in the NFC card 100, and the speaker 22 outputs, with voice, the fortune-telling result corresponding to the blood type (S6). In S6, the LED 15 will go out when a certain length of time has passed.

In contrast, in a case where the two pieces of identification information are not identical to each other (NO in S5), the ID collating unit 232 determines whether or not the number n indicating the identification information set in S3 is equal to or greater than the registered number N of the pieces of identification information stored in the storage 24 (i.e., ID registration number) (S7). In a case where the ID collating unit 232 determines that the number n indicating the identification information is equal to or greater than the registered number N(YES in S7), the ID collating unit 232 sends, to the output-mode identifying unit 233, a collation result indicating that the two pieces of identification information are not identical. In this case, the output-mode identifying unit 233 reads out, from the storage 24, the LED lighting-up information and the audio information corresponding to the NFC card 100 recording the identification information not registered in the storage 24, and controls the output control circuit 212 to cause the LED 15 and the speaker 22 to output the corresponding light and voice, respectively. In contrast, in a case where the ID collating unit 232 determines that the number n indicating the identification information is less than the registered number N (NO in S7), the flow proceeds back to the process in S3.

Now, suppose that the number n indicating the identification information is defined, for instance, as: n=1 corresponds to type A, n=2 corresponds to type B, n=3 corresponds to type O, and n=4 corresponds to type AB. In this case, the number N of registered items in the storage 24 is four (i.e., N=4). In addition, suppose that the blood type indicated by the identification information recorded in the NFC card 100 held over the transparent panel 10 is type B (i.e., n=2).

In this case, the ID collating unit 232 sets the number n indicating the identification information to zero (i.e., n=0) in S2, and then in S3, the number n is incremented by one to set the number n to one (i.e., n=1) (type A). The ID collating unit 232 collates the above-mentioned two pieces of identification information in S4, but the identification information recorded in the NFC card 100 is type B (i.e., n=2). Hence, the ID collating unit 232 determines, in S5, that the two pieces of identification information are not identical (NO in S5), and the flow proceeds to the process of S7. The ID collating unit 232 determines that the number n set to 1 is less than the registered number N that is 4 (NO in S7), and the flow proceeds back to the process of S3.

The ID collating unit 232 increments the number n by one, in S3, to set the number n to two (i.e., n=2) (type B). When the ID collating unit 232 collates the above-mentioned two pieces of identification information in S4, the ID collating unit 232 determines that the two pieces of identification information are identical (n=2; type B) to each other (YES in S5), and the flow proceeds to the process of S6. Hence, the LED lighting-up information and audio information corresponding to the number n=2 are selected, and in accordance with the selected LED lighting-up information and audio information, the LED 15 emits light and the speaker 22 outputs the sound and voice.

In a case where, for instance, the NFC card 100 records identification information other than the identification information indicating the blood type (i.e., the NFC card 100 records identification information corresponding to n≠1 to 4), the ID collating unit 232 repeatedly executes the processes in S3 to S7 for the number n=1 to 4. Then, in a case where the ID collating unit 232 determines that, for the number n=4, the answer for the inquiry in S5 is NO, and determines, in S7, that the above-mentioned number n=4 is the same as the number of the registered item N=4 (the number n is equal to or greater than the number N of the registered items) (i.e., YES in S7), the flow proceeds to the process of S8. Hence, the LED lighting-up information and the audio information corresponding to the NFC card 100 recording the identification information not registered are selected, and in accordance with the selected LED lighting-up information and audio information, the LED 15 emits light and the speaker 22 outputs the sound and voice. In S8, the LED 15 will go out when a certain length of time has passed.

Major Effect

The light-emitting device 1 of the present embodiment includes the light guide plate 12, the NFC antenna 14, and the LED 15. At least some part of the light that has been guided by the light guide plate 12 is allowed to exit out of the light guide plate 12 through the principal surface 12f of the light guide plate 12. The LED 15 emits light on the basis of the identification information obtained through the communications with the NFC card 100 via the NFC antenna 14.

Hence, according to the light-emitting device 1, the light emitted from the LED 15 makes the light guide plate 12 emit light, which increases the light-emitting area from the corresponding area of the case where only the LED 15 is made to emit light. Accordingly, the user visually recognizes the light emission more easily. In addition, the transparent NFC antenna 14 is provided as an antenna for communications. Hence, even in a case where the NFC antenna 14 is disposed on the principal surface 12f (or on the backside surface 12r as will be described later) of the light guide plate 12, the light emitted from the light guide plate 12 is prevented from having lowered viewability.

In addition, the NFC antenna 14 is disposed in the light guide plate 12, which is a plate-shaped member. Hence, even in a case where the NFC card 100 is held over any one of the principal surface 12f and the backside surface 12r, the communications are enabled therebetween.

In addition, the light guide plate 12 has certain transparency enabling the light that comes from outside and that enters through the principal surface 12f to go out through the backside surface 12r. Hence, the user may view, with his/her eyes, an object that is present in the external space facing the backside surface 12r. In addition, when an object is placed in the external space on the backside surface 12r side, the user holds the NFC card 100 over the NFC antenna 14 from the principal surface 12f by imagining that he/she accesses that object thus placed, and thus enables the communications between the NFC card 100 and the NFC antenna 14. Hence, even in a case where it is difficult for the user to visually recognize the NFC antenna 14, the user reliably holds the NFC card 100 over such an NFC antenna. In addition, as the light guide plate 12 is transparent as described earlier, the light guide plate 12 has an excellent design.

Modified Example (a) In the above-described configuration, the NFC antenna 14 is disposed on the principal surface 12f of the light guide plate 12, but this is not the only possible configuration. In a configuration where the light L coming from the LED 15 exits mainly through the principal surface 12f, the NFC antenna 14 may be disposed on the backside surface 12r. In this case, the configuration may be understood as the antenna layer including both the NFC antenna sheet 11 and the NFC antenna 14 being formed on the backside surface 12r.

(b) In the above-described configuration, the recess 13 is formed in the backside surface 12r of the light guide plate 12, but this is not the only possible configuration. Instead, the recess 13 may be formed in the principal surface 12f.

(c) It is not always necessary to provide the NFC antenna sheet 11. Instead, for instance, the NFC antenna 14 may be disposed directly on the principal surface 12f or the backside surface 12r of the light guide plate 12. In this case, mainly the NFC antenna 14 functions as a transparent antenna layer.

(d) In the above-described configuration, the base 20 is described to include the control board 21, the speaker 22, the controller 23, and the storage 24, but this is not the only possible configuration. For instance, the base 20 simply may function as a casing for supporting the transparent panel 10, and a control device (external box) including the control board 21, the speaker 22, the controller 23, and the storage 24 may be connected to the NFC antenna 14 and the LED 15 of the transparent panel 10 in a communicable manner. In this case, the NFC antenna 14 and the LED 15 may be connected to the control device by cables or the like (i.e., a wired connection) or may be connected wirelessly.

In addition, a portion of the light guide plate 12 may be opaque, and the control board 21 and the like may be disposed on the opaque portion. In addition, the speaker 22 may be provided as a separate body from the base 20 or the control device.

(e) The speaker 22 is not essential element of the configuration, and thus it is not necessary for the light-emitting device 1 to include the speaker 22. In this case, the output control circuit 212 performs only the lighting-up control of the LED 15.

(f) A liquid crystal panel may be disposed on the surface of the light guide plate 12 where the NFC antenna 14 is disposed (e.g., on the principal surface 12f) or on the opposite surface (e.g., on the backside surface 12r). Note that the liquid crystal panel is not equipped with any back light or any backside reflector plate. In a case where the liquid crystal shutter is opened, the liquid crystal panel functions as a transparent panel. In this case, by including control information for controlling the liquid crystal panel in the LED lighting-up information, an image may be displayed in accordance with the result of collation performed by the ID collating unit 232.

Alternatively, by providing a transparent display such as an organic EL panel in place of the liquid crystal panel, the image may be displayed without sacrificing the transparency that the transparent panel 10 should have.

Second Embodiment

Hereinafter, the second embodiment according to an aspect of the present invention will be described with reference to FIG. 6A to FIG. 9. Note that, for convenience of description, components illustrated in respective embodiments are designated by the same reference numerals as those having the same function, and the descriptions of these components will be omitted.

Figure 8:
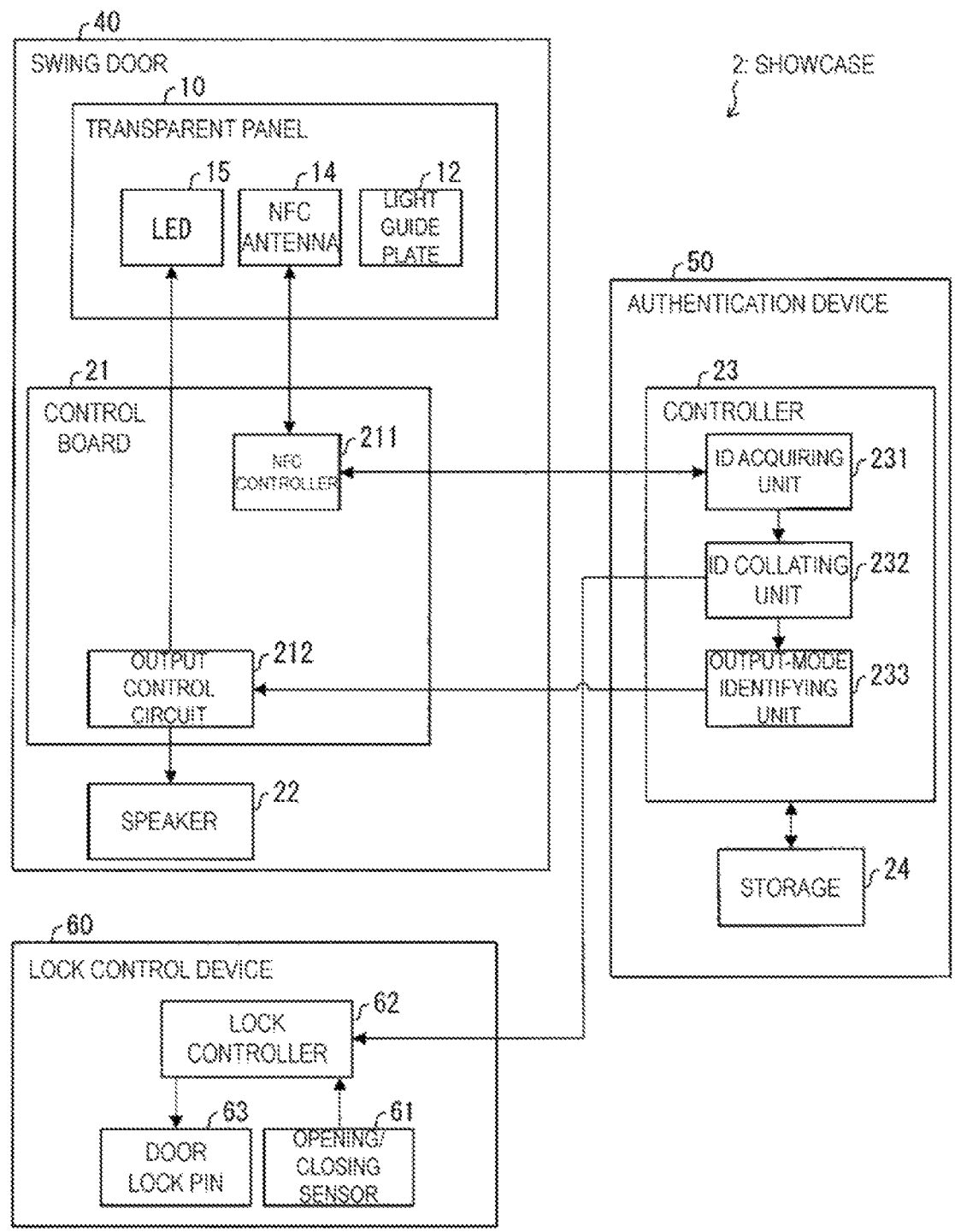
FIG. 8 is a drawing illustrating a specific configuration of a showcase of the second embodiment.

In the present embodiment, a description will be provided of a case where a basic configuration of the light-emitting device 1 of the first embodiment is applied to a swing door 40 (door) of a showcase 2 (authentication notification system) illustrated in FIGS. 6A and 6B. Specifically, as illustrated in FIG. 7, in the showcase 2, while the transparent panel 10 of the light-emitting device 1 includes the light guide plate 12, the NFC antenna 14, and the LEDs 15, the transparent panel 10 is applied to the swing door 40. In addition, the showcase 2 includes an authentication device 50 and a lock control device 60 in place of the base 20 of the light-emitting device 1, as illustrated in FIG. 8. In addition, the controller 23 of the authentication device 50 controls the control board 21 and thus controls the lighting-up of the LEDs 15 on the basis of the result of authentication for the NFC card 100. In addition, the NFC card 100 records, as the above-described identification information, a piece of information unique to the individual user for identifying the user who owns the NFC card 100. Hereinafter, a specific description is provided with reference to FIG. 6A to FIG. 8.

Configuration of Showcase 2

To begin with, a configuration of the showcase 2 will be described with reference to FIG. 6A to FIG. 7. FIGS. 6A and 6B illustrate drawings illustrating external appearances of the showcase 2 of the present embodiment. FIG. 6A illustrates a state where the swing door 40 is closed, and FIG. 6B illustrates a state where the swing door 40 is opened. FIG. 7 is a drawing illustrating a structure of the swing door 40.

As illustrated in FIG. 6A and FIG. 6B, the showcase 2 includes a casing 30 and the swing door 40. The casing 30 defines the space inside the box-shaped showcase 2. The swing door 40 is a door configured to allow the showcase 2 to open/close. The swing door 40, which has a rectangular shape, allows the showcase 2 to open and close by pivoting on a shaft along a side of the rectangular shape. Note that the shape of the swing door 40 is not limited to a rectangular shape. Any shape that maintains the function of the showcase 2 may be employed, instead.

In addition, the transparent panel 10 of the first embodiment is used for the swing door 40 as illustrated in FIG. 7. Hence, the transparent swing door 40 allows the user to visually recognize what is in the showcase 2 even in a case where the swing door 40 is closed. Some of the components included in the swing door 40 may be the components included in the transparent panel 10 of the first embodiment: specifically, the light guide plate 12, the recess 13, the NFC antenna 14, and the LEDs 15. Note that the casing 30 may be transparent or may be opaque.

In addition, the control board 21 included in the swing door 40 controls the NFC antenna 14 as is the case with the first embodiment. Hence, when the NFC card 100 is brought to the proximity of the swing door 40, the authentication device 50 (see FIG. 8) may read out identification information from the NFC card 100 through the communications via the NFC antenna 14 and may perform authentication by use of the identification information. In addition, the control board 21 can control the LEDs 15 so that the LEDs 15s light up, on the basis of the result of authentication performed by the authentication device 50.

In addition, the swing door 40 includes a door support column 41, door frame 42, a lock controller 62, and a door lock pin 63.

The door support column 41 is a support column configured to attach the swing door 40 to the casing 30 while allowing the swing door 40 to be opened/closed freely. The door support column 41 is disposed along a side of the rectangular-shaped swing door 40. The door frame 42 is a frame to cover the perimeter of the swing door 40.

The lock controller 62 controls the door lock pin 63 on the basis of the result of authentication performed by the authentication device 50 and the result of sensing performed by an opening/closing sensor 61 (see FIG. 8). The door lock pin 63 is switched by the lock controller 62 between a state where the door lock pin 63 sticks out towards the casing 30 (locked state) and a state where the door lock pin 63 does not stick out (unlocked state). In the locked state, the door lock pin 63 engages with a lock hole (not illustrated) formed in the casing 30. Hence, in the locked state, opening the swing door 40 is not possible.

In addition, in the present embodiment, the NFC antenna 14, the LEDs 15, the control board 21, the lock controller 62, and the door lock pin 63 are disposed near the opposite side to the side where the door support column 41 of the swing door 40 is disposed. Specifically, the control board 21 is disposed near the center along the opposite side. The NFC antenna 14 is disposed to extend from the control board 21 towards the center of the swing door 40. The LEDs 15 are arranged in parallel to the opposite side and disposed at a position further away from the opposite side than a position of the control board 21. The lock controller 62 and the door lock pin 63 are disposed on the opposite side at a position closer to an end than the center of the side.

Note that the location of these members may be altered appropriately within a certain range without sacrificing the functions of swing door 40. Likewise, the number of recesses 13, the number of LEDs 15, and the number of NFC antennas 14 may be appropriately altered. In a case where a plurality of NFC antennas 14 are provided, a plurality of control boards 21 may be provided to correspond individually to the plurality of NFC antennas 14. Alternatively, only a single common control board 21 may be provided for all the plurality of NFC antennas 14.

Specific Configuration of Showcase 2

Next, a specific configuration of the showcase 2 will be described with reference to FIG. 8. FIG. 8 is a drawing illustrating a specific configuration of the showcase 2 of the present embodiment. As illustrated in FIG. 8, the showcase 2 includes the swing door 40, the authentication device 50, and the lock control device 60. The swing door 40 includes the transparent panel 10, the control board 21, and the speaker 22. The components included in the swing door 40 have identical configurations to those described in the first embodiment.

Authentication Device 50

The authentication device 50 performs authentication by use of the identification information received from the NFC card 100 via the NFC antenna 14. Specifically, the authentication device 50 performs authentication of the user who owns the NFC card 100. The authentication device 50 includes the controller 23 and the storage 24. In addition, the authentication device 50 is connected to both the swing door 40 and the lock control device 60 in either a wired or a wireless manner and in a communicable manner.

The controller 23 is configured to integrally control the authentication device 50. The storage 24 stores: (1) a software program for making the authentication device 50 perform authentication; and (2) LED lighting-up information indicating the lighting-up states of the LEDs 15 and audio information corresponding individually to a state where opening/closing the swing door 40 is possible and a state where opening/closing the swing door 40 is not possible.

The controller 23 includes the ID acquiring unit 231, the ID collating unit 232, and the output-mode identifying unit 233 for the purposes of implementing the activation and the control of the software program. Similar to the ID acquiring unit 231 of the first embodiment, the ID acquiring unit 231 acquires, via the NFC controller 211, the identification information recorded in the NFC card 100.

The ID collating unit 232 functions as the authentication circuitry configured to carry out authentication by use of the identification information received via the NFC antenna 14. Specifically, the ID collating unit 232 collates the identification information received via the NFC antenna 14 with the identification information stored in the storage 24, and sends the collation result (authentication result) to the output-mode identifying unit 233.

Specifically, the ID collating unit 232 identifies the user indicated by the identification information acquired from the ID acquiring unit 231, and determines whether or not the storage 24 stores any identification information indicating the same user. Then, the ID collating unit 232 sends the determination result (collation result) to the output-mode identifying unit 233, and the lock controller 62 of the lock control device 60.

The output-mode identifying unit 233 identifies the mode of light emission by the LEDs 15 on the basis of the collation result sent from the ID collating unit 232. Specifically, the output-mode identifying unit 233 refers to the storage 24, and thus identifies the light-emission mode corresponding to the state where opening/closing the swing door 40 is possible or the light-emission mode corresponding to the state where opening/closing the swing door 40 is not possible. To be more specific, when the collation result indicates that the two pieces of identification information are identical to each other, the output-mode identifying unit 233 selects the light-emission mode indicating the state where opening/closing the swing door 40 is possible. In contrast, when the two pieces of identification information are not identical to each other, the output-mode identifying unit 233 selects the light-emission mode indicating the state where opening/closing the swing door 40 is not possible. In addition, when the collation result indicates that the two pieces of identification information are identical to each other, the output-mode identifying unit 233 selects the voice or notification sound indicating the state where opening/closing the swing door 40 is possible. In contrast, when the two pieces of identification information are not identical to each other, the output-mode identifying unit 233 selects the voice or notification sound indicating the state where opening/closing the swing door 40 is not possible.

Then, the output-mode identifying unit 233 sends, to the output control circuit 212, LED lighting-up information indicating the identified light-emission mode, and audio information indicating the identified voice or the notification sound. The output control circuit 212 controls the LEDs 15 so that the LEDs 15 light up in accordance with the light-emission mode indicated by the received LED lighting-up information and the speaker 22 so that the speaker 22 outputs the audio information.

As such, by the processing performed by the control board 21 and the controller 23, the LED 15 emits light on the basis of the information obtained through the communications via the NFC antenna 14 (i.e., on the basis of the identification information recorded in the NFC card 100). Specifically, in the present embodiment, the LEDs 15 emit light on the basis of the result of authentication performed by the ID collating unit 232. Then, as is the case with the first embodiment, the light having been emitted from the LEDs 15 and guided by the light guide plate 12 exits mainly through the principal surface 12f of the light guide plate 12. Note that some part of the light may exit through the backside surface 12r of the light guide plate 12 as is the case with the first embodiment.

Lock Control Device 60

The lock control device 60 is configured to perform a lock control for the swing door 40, and includes an opening/closing sensor 61, the lock controller 62, and the door lock pin 63. The lock controller 62 and the door lock pin 63 are described above. Hence, no additional description will be given below.

The opening/closing sensor 61 senses whether the swing door 40 is in the opened state or in the closed state. The opening/closing sensor 61 is attached, for instance, to the opposite side of the swing door 40 (e.g., near the lock controller 62). This is not the only possible position of the opening/closing sensor 61. For instance, the opening/closing sensor 61 may be attached to the casing 30 at a position facing the lock controller 62 of the swing door 40 when the swing door 40 is in the closed state. The opening/closing sensor 61 sends, to the lock controller 62, the sensing result indicating whether the swing door 40 is in the opened state or in the closed state.

Processes Performed in Showcase 2

Figure 9:
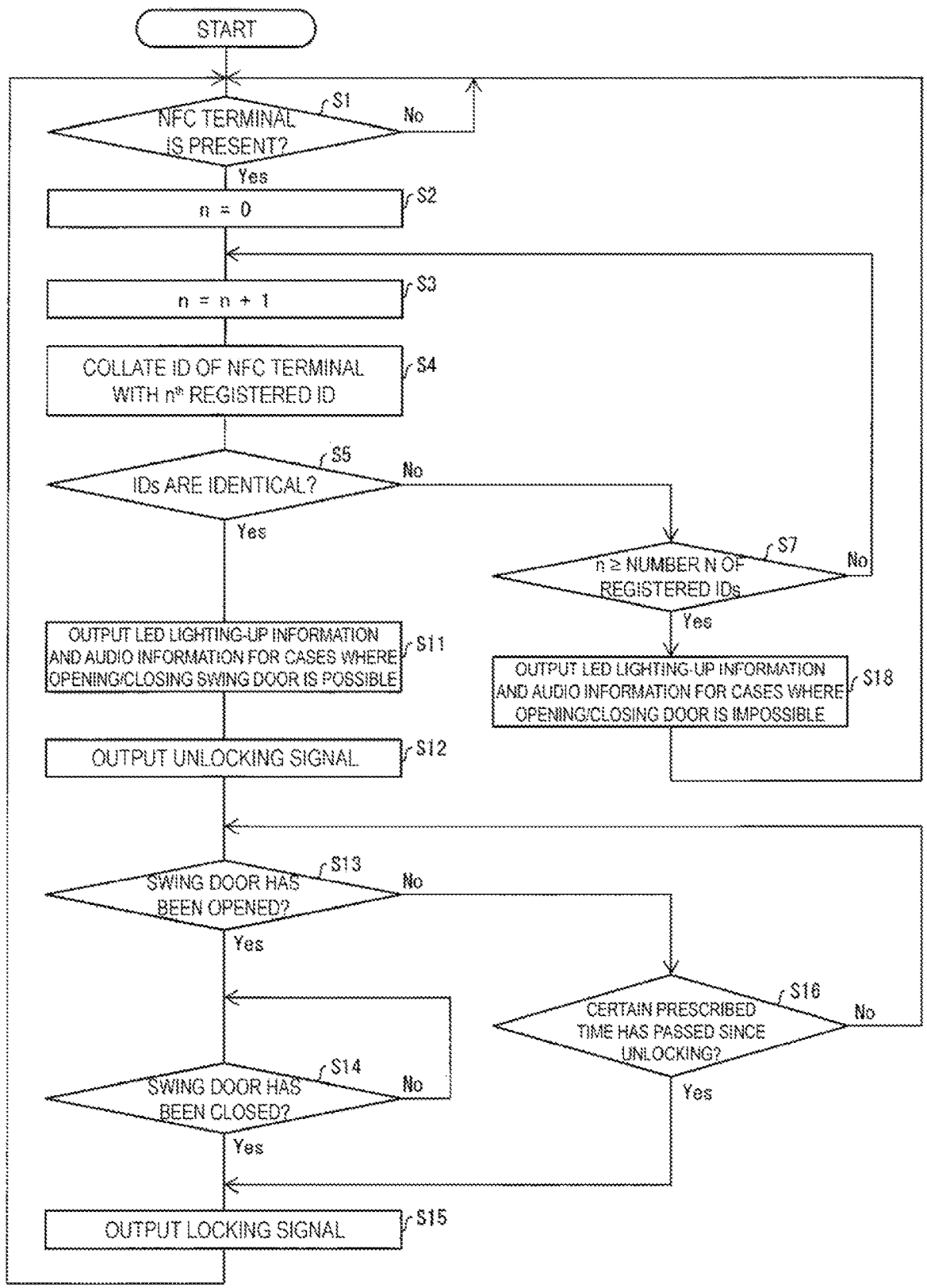
FIG. 9 is a flow chart illustrating a flow of processes performed in a showcase of the second embodiment.

Next, a flow of processes performed in the showcase 2 of the present embodiment will be described below with reference to FIG. 9. FIG. 9 is a flow chart illustrating a flow of processes performed in the showcase 2 of the present embodiment. The processes of S1 to S5 and the process of S7 are similar to their respective ones illustrated in FIG. 5 of the first embodiment.

In a case where the two pieces of identification information are identical to each other (YES in S5), the ID collating unit 232 sends, to the output-mode identifying unit 233, the collation result indicating the identity. In this case, the output-mode identifying unit 233 sends, to the output control circuit 212: the LED lighting-up information stored in the storage 24 and indicating the light-emission mode in which the swing door 40 is in an opening/closing enabled state; and the audio information indicating that the swing door 40 is in such a state. Hence, the LEDs 15 emit light indicating that the authentication is successful and the swing door 40 is in the opening/closing enabled state. In addition, the speaker 22 outputs a voice or a notification sound indicating that the swing door 40 is in such a state (S11).

In contrast, in a case where the two pieces of identification information are not identical to each other (NO in S5), the ID collating unit 232 performs the process in S7. In a case where the ID collating unit 232 determines that the number n having been set in S3 and indicating the identification information is equal to or greater than the registered number N (YES in S7), the ID collating unit 232 sends, to the output-mode identifying unit 233, a collation result indicating that the two pieces of identification information are not identical. In this case, the output-mode identifying unit 233 sends, to the output control circuit 212: the LED lighting-up information stored in the storage 24 and indicating the light-emission mode in which the swing door 40 is in an opening/closing disabled state; and the audio information indicating that the swing door 40 is in such a state. Hence, the LEDs 15 emit light indicating that the authentication is unsuccessful and the swing door 40 is in the opening/closing disabled state (a state where opening the swing door 40 is not possible). In addition, the speaker 22 outputs a voice or a notification sound indicating that the swing door 40 is in such a state (S18). In contrast, in a case where the ID collating unit 232 determines that the above-mentioned number n is less than the registered number N (NO in S7), the flow proceeds back to the process in S3.

In a case of YES in S5, the lock controller 62 outputs, on the basis of the result of the collation performed by the ID collating unit 232 (specifically, the result indicating a successful authentication), an unlocking signal for unlocking the door lock pin 63 to the door lock pin 63 (S12). The door lock pin 63 thus becomes unable to stick out, allowing the user to open the swing door 40.

The lock controller 62 determines, on the basis of the result of sensing performed by the opening/closing sensor 61, whether or not the swing door 40 has been opened (S13). In a case where the lock controller 62 determines that the swing door 40 has been opened (YES in S13), then the lock controller 62 determines, on the basis of the result of sensing performed by the opening/closing sensor 61, whether the swing door 40 has been closed after that (S14). In a case where the lock controller 62 determines that the swing door 40 has been closed (YES in S14), the lock controller 62 outputs, to the door lock pin 63, a locking signal for locking the door lock pin 63 (S15). The door lock pin 63 thus becomes locked. In contrast, in a case of NO in S14, the lock controller 62 continues the monitoring until the swing door 40 is closed.

In a case where, on the other hand, the lock controller 62 determines that the swing door 40 is able to be opened but has not been opened yet (NO in S13), the lock controller 62 determines whether or not a certain prescribed length of time has passed since the swing door 40 became in such a state (S16). In a case where the lock controller 62 determines that the certain prescribed length of time has already passed (YES in S16), the lock controller 62 outputs, to the door lock pin 63, a locking signal for locking the door lock pin 63 (S15). Then in S15, the LEDs 15 goes out. In contrast, in a case of NO in S16, the flow proceeds back to the process in S13.

Now, suppose that the number n indicating the identification information is defined, for instance, as: n=1 corresponds to user A, n=2 corresponds to user B, and n=3 corresponds to user C. In this case, the number N of registered items in the storage 24 is three (i.e., N=3). In addition, suppose that the user indicated by the identification information recorded in the NFC card 100 held over the swing door 40 is user B (i.e., n=2). Also in this case, similar processes to their respective ones in the first embodiment are to be performed.

Specifically, the ID collating unit 232 sets the number n to zero (i.e., n=0) in S2, and then in S3, the number n is incremented by one to set the number n to one (i.e., n=1) (user A). Since the identification information recorded in the NFC card 100 is user B (i.e., n=2), the ID collating unit 232 determines, in S5, that the two pieces of identification information are not identical (NO in S5), and the flow proceeds to the process of S7. The ID collating unit 232 determines that the number n set to 1 is less than the registered number N that is 3 (NO in S7), and the flow proceeds back to the process of S3.

The ID collating unit 232 increments the number n by one to set the number n to two (i.e., n=2) (user B). This time, the ID collating unit 232 determines that the two pieces of identification information are identical (n=2; user B) to each other (YES in S5), and the flow proceeds to the process of S11. Hence, the LED lighting-up information and audio information corresponding to the number n=2 are selected, and in accordance with the selected LED lighting-up information and audio information, the LEDs 15 emit light and the speaker 22 outputs the sound and voice. In addition, as it is determined in S5 that the authentication is successful, the lock control device 60 performs a lock control for the swing door 40 (S13 to S16).

In a case where, for instance, the NFC card 100 records identification information indicating a user other than the user registered in the storage 24 (i.e., the NFC card 100 records identification information corresponding to n≠1 to 3), the ID collating unit 232 repeatedly executes the processes in S3 to in S7 for the number n=1 to 3. Then, in a case where the ID collating unit 232 determines that, for the number n=3, the answer for the inquiry in S5 is No, and determines, in S7, that the above-mentioned number n=3 is the same as the number of the registered item N=3 (i.e., YES in S7), the flow proceeds to the process of S18. Hence, the LED lighting-up information and the audio information corresponding to the NFC card 100 having the identification information not registered are selected, and in accordance with the selected LED lighting-up information and audio information, the LEDs 15 emit light and the speaker 22 outputs the sound and voice. In addition, also in this case, as it is determined in S5 that the authentication is unsuccessful, the lock control device 60 performs no lock control for the swing door 40.

Major Effect

The showcase 2 of the present embodiment includes a basic configuration of the light-emitting device 1 of the first embodiment. Specifically, the showcase 2 includes the light guide plate 12, the NFC antenna 14, and the LEDs 15. At least some part of the light that has been guided by the light guide plate 12 is allowed to exit out of the light guide plate 12 through the principal surface 12f of the light guide plate 12. The LED 15 emits light on the basis of the identification information obtained through the communications with the NFC card 100 via the NFC antenna 14. Hence, the showcase 2 has similar effects to those obtained by the light-emitting device 1 of the first embodiment.

In addition, in the showcase 2, the LEDs 15 emit light on the basis of the result of collation performed by the ID collating unit 232. Hence, the user may be notified of the collation result by the light emission of the light guide plate 12.

In addition, the showcase 2 includes the basic configuration of the light-emitting device 1 in at least a portion of the swing door 40. Hence, by making the light guide plate 12 incorporated in the swing door 40 emit light, the user who uses the swing door 40 may receive notification based on the identification information obtained through the communications via the transparent NFC antenna 14. In addition, the swing door 40 communicates with the authentication device 50, and thus the LEDs 15 emit light on the basis of the result of authentication performed by the authentication device 50 (i.e., the result of collation performed by the ID collating unit 232). Hence, by making the light guide plate 12 incorporated in the swing door 40 emit light, the user who uses the swing door 40 may be notified of the authentication result.

Modified Example

The above-described swing door 40 is connected to the authentication device 50 in a communicable manner, but a configuration where the swing door includes the authentication device 50 may be employed.

Third Embodiment

Hereinafter, the third embodiment according to an aspect of the present invention will be described with reference to FIG. 10A to FIG. 14. Note that, for convenience of description, components illustrated in respective embodiments are designated by the same reference numerals as those having the same function, and the descriptions of these components will be omitted.

Figure 12:
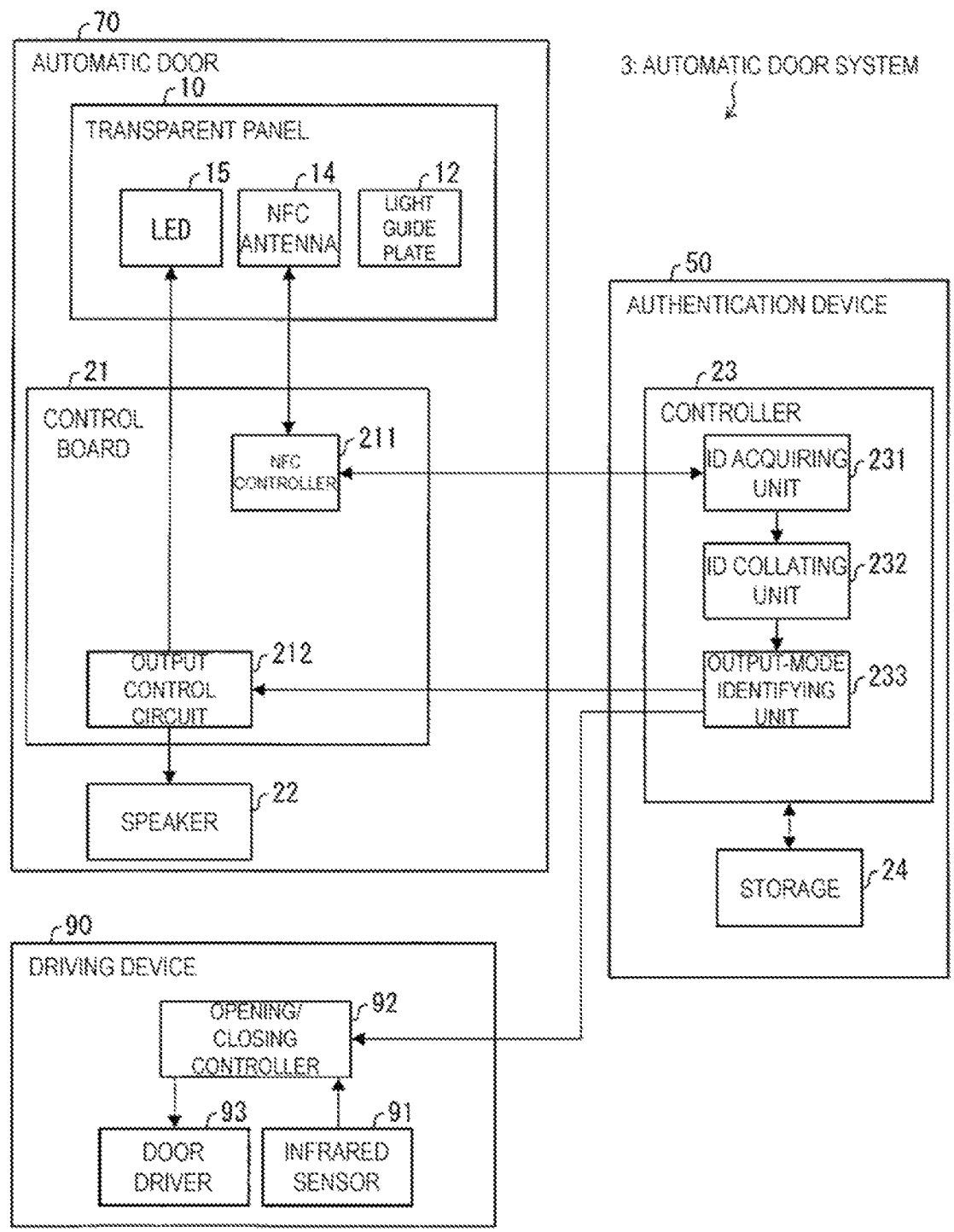
FIG. 12 is a drawing illustrating a specific configuration of an automatic door system of the third embodiment.

In the present embodiment, a description will be provided of a case where a basic configuration of the light-emitting device 1 of the first embodiment is applied to an automatic door system (authentication notification system) 3 illustrated in FIGS. 10A and 10B. Specifically, as is the case with the second embodiment, as illustrated in FIG. 11, in the automatic door system 3, the transparent panel 10 (the light guide plate 12, the NFC antenna 14, and the LEDs 15) of the light-emitting device 1 is applied to an automatic door 70 (door). In addition, the automatic door system 3 includes the authentication device 50 and a driving device 90 in place of the base 20 of the light-emitting device 1, as illustrated in FIG. 12. The authentication device 50 and the NFC card 100 that is supposed to be authenticated by the authentication device 50 are similar to their respective ones in the second embodiment. Hereinafter, a specific description is provided with reference to FIG. 10A to FIG. 12.

Configuration of Automatic Door System 3

To begin with, a configuration of the automatic door system 3 will be described with reference to FIG. 10A to FIG. 11. FIGS. 10A and 10B are drawings illustrating external appearances of the automatic door system 3 of the present embodiment. FIG. 10A illustrates a state where the automatic door 70 is closed, and FIG. 10B illustrates a state where the automatic door 70 is opened. FIG. 11 is a drawing illustrating a structure of the automatic door 70.

As illustrated in FIG. 10A and FIG. 10B, the automatic door system 3 includes the automatic door 70 and a door pocket 80. Specifically, the automatic door system 3 is left-right symmetrical, has two automatic doors 70 in the center thereof. The door pockets 80, one of them for the left-hand side and the other for the right-hand side, are provided on the outer side of each of the two automatic doors 70. FIG. 11 illustrates one of the two automatic doors 70 and the corresponding door pocket 80. The other automatic door or the other door pocket is not illustrated. Each of the two central automatic doors 70 is opened by moving leftwards or rightwards, and is housed in the corresponding door pocket 80 so that the door 70 and its corresponding door pocket overlap. In the present embodiment, the two automatic doors 70 and the two door pockets 80 are transparent. Hence, even in a case where the automatic doors 70 are closed, the user may visually recognize what is beyond the automatic doors 70. Note that the automatic door system 3 may include only a single automatic door 70 and only a single door pocket 80.

As illustrated in FIG. 11, the automatic door 70 includes the light guide plate 12, the recesses 13, the NFC antenna 14, the LEDs 15, the control board 21, and a glass plate 71. In addition, the door pocket 80 includes a glass plate 81. In addition, the automatic door system 3 includes an infrared sensor 91, an opening/closing controller 92, and a door driver 93 above the automatic door 70.

Some of the components included in the automatic door 70 are the components included in the transparent panel 10 of the first embodiment. The components include the light guide plate 12, the recesses 13, the NFC antenna 14, and the LEDs 15 and buried in the glass plate 71. In addition, the control board 21 performs control of the NFC antenna 14 as is the case with the first embodiment. Hence, when the NFC card 100 is brought to the proximity of the automatic door 70, the authentication device 50 (see FIG. 12) may read out identification information from the NFC card 100 through the communications via the NFC antenna 14 and may perform authentication by use of the identification information. In addition, control of the lighting-up of the LEDs 15s may be performed on the basis of the result of authentication performed by the authentication device 50.

The infrared sensor 91 is configured to sense whether or not there is a person standing in front of the automatic door 70. In a case where the opening/closing controller 92 receives an opening/closing control command from the output-mode identifying unit 233, the opening/closing controller 92 controls the door driver 93 on the basis of the result of sensing performed by the infrared sensor 91. The door driver 93 is made, by the opening/closing controller 92, to switch the automatic door 70 between the opened state and the closed state.

Specific Configuration of Automatic Door System 3

Next, a specific configuration of the automatic door system 3 will be described with reference to FIG. 12. FIG. 12 is a drawing illustrating a specific configuration of the automatic door system 3 of the present embodiment. As illustrated in FIG. 12, the automatic door system 3 includes the automatic door 70, the authentication device 50, and the driving device 90. The automatic door 70 includes the transparent panel 10, the control board 21, and the speaker 22. The components included in the automatic door 70 have identical configurations to those described in the first embodiment.

In addition, the authentication device 50 has the identical basic configuration and functions to those described in the second embodiment. Specifically, the authentication device 50 includes the controller 23 and the storage 24. In addition, the authentication device 50 is connected to both the automatic door 70 and the driving device 90 in either a wired or a wireless manner and in a communicable manner. In addition, the storage 24 stores LED lighting-up information indicating the lighting-up states of the LEDs 15 and audio information corresponding individually to a state where opening/closing the automatic door 70 is possible and a state where opening/closing the automatic door 70 is not possible.

Note that in the present embodiment, the output-mode identifying unit 233 sends, to the output control circuit 212, the LED lighting-up information and audio information indicating that opening/closing the automatic door 70 is possible. In addition, the output-mode identifying unit 233 sends, to the opening/closing controller 92, an opening/closing control command for opening/closing the automatic door 70. Note that similar processes may be carried out in the second embodiment.

Alternatively, as is the case with the second embodiment, the output-mode identifying unit 233 may send, to the opening/closing controller 92, the result of collating performed by the ID collating unit 232 (result indicating the authentication success) instead of the opening/closing control command. In this case, in a case where the opening/closing controller 92 receives the result of collation performed by the ID collating unit 232, the opening/closing controller 92 performs the relevant process.

The driving device 90 is configured to perform a control of opening/closing the automatic door 70, and includes the infrared sensor 91, the opening/closing controller 92, and the door driver 93. Details of each portion are described above. Hence no additional description will be given below.

Processes Performed in Automatic Door System 3

Figure 13:
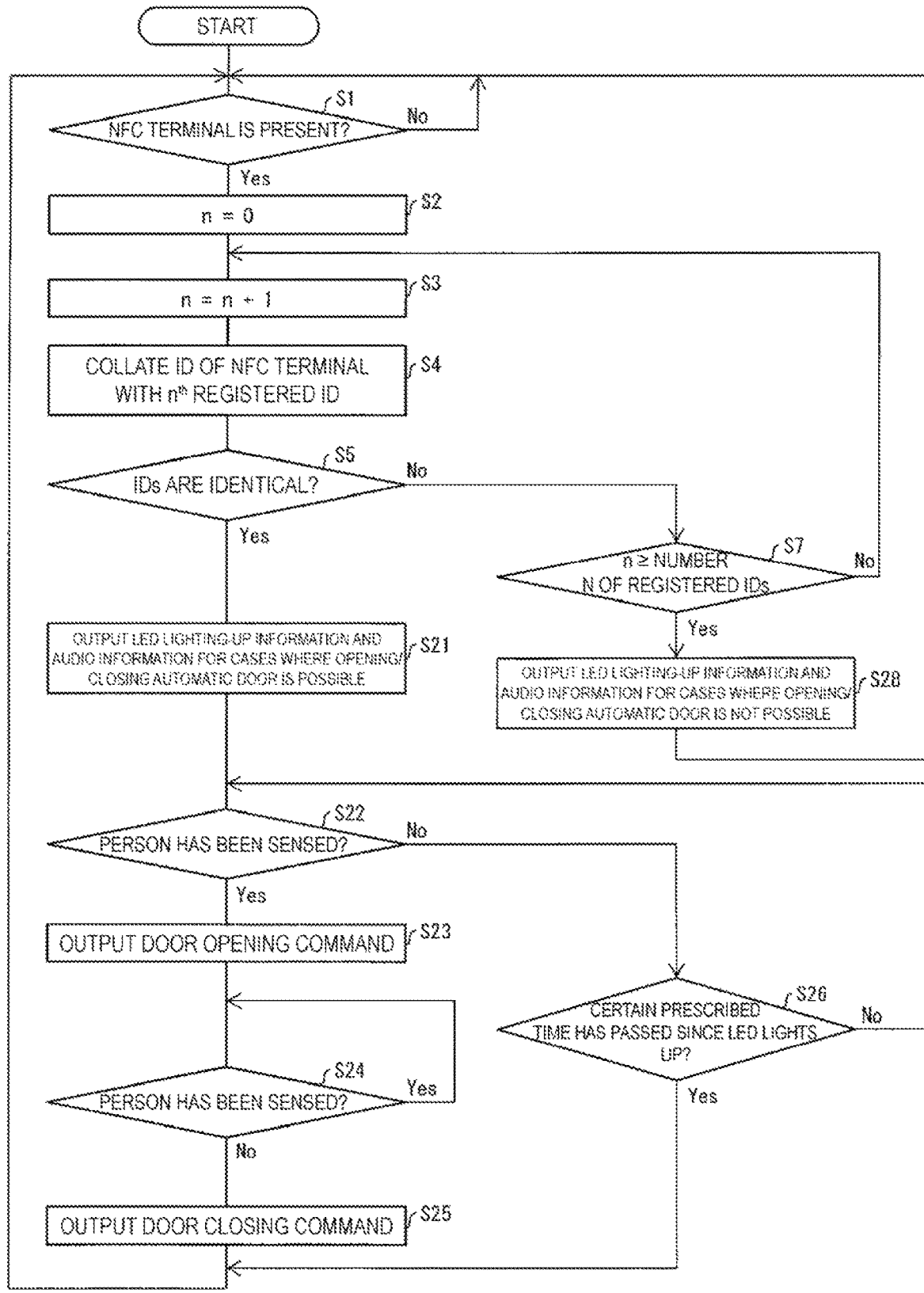
FIG. 13 is a flow chart illustrating a flow of processes performed in an automatic door system of the third embodiment.

Next, a flow of processes performed in the automatic door system 3 of the present embodiment will be described below with reference to FIG. 13. FIG. 13 is a flow chart illustrating a flow of processes performed in the automatic door system 3 of the present embodiment. The processes of S1 to S5 and the process of S7 are similar to their respective ones illustrated in FIG. 5 of the first embodiment.

In a case where the identification information received via the NFC antenna 14 and the identification information stored in the storage 24 are identical to each other (YES in S5), the ID collating unit 232 sends, to the output-mode identifying unit 233, the collation result indicating the identity. In this case, the output-mode identifying unit 233 sends, to the output control circuit 212: the LED lighting-up information stored in the storage 24 and indicating the light-emission mode in which the automatic door 70 is in an opening/closing enabled state; and the audio information indicating that the automatic door 70 is in such a state. Hence, the LEDs 15 emit light indicating that the authentication is successful and the automatic door 70 is in the opening/closing enabled state. In addition, the speaker 22 outputs a voice or a notification sound indicating that the automatic door 70 is in such a state (S21).

In contrast, in a case where the two pieces of identification information are not identical to each other (NO in S5), the ID collating unit 232 performs the process in S7. In a case where the ID collating unit 232 determines that the number n having been set in S3 and indicating the identification information is equal to or greater than the registered number N (YES in S7), the ID collating unit 232 sends, to the output-mode identifying unit 233, a collation result indicating that the two pieces of identification information are not identical. In this case, the output-mode identifying unit 233 sends, to the output control circuit 212: the LED lighting-up information stored in the storage 24 and indicating the light-emission mode in which the automatic door 70 is in an opening/closing disabled state; and the audio information indicating that the automatic door 70 is in such a state. Hence, the LEDs 15 emit light indicating that the authentication is unsuccessful and the automatic door 70 is in the opening/closing disabled state (a state where opening the automatic door 70 is not possible). In addition, the speaker 22 outputs a voice or a notification sound indicating that the automatic door 70 is in such a state (S28). In contrast, in a case where the ID collating unit 232 determines that the above-mentioned number n is less than the registered number N (NO in S7), the flow proceeds back to the process in S3.

In addition, in a case of YES in S5, the opening/closing controller 92 determines, on the basis of the result of sensing performed by the infrared sensor 91, whether or not the infrared sensor 91 has sensed a person standing in front of the automatic door 70 (S22). In a case where the opening/closing controller 92 determines that a person has been sensed (YES in S22), the opening/closing controller 92 outputs, to the door driver 93, a door opening command for making the automatic door 70 be in an opened state (S23). The automatic door 70 is thus opened. After that, the opening/closing controller 92 determines, on the basis of the result of sensing performed by the infrared sensor 91, whether or not the infrared sensor 91 has sensed a second person standing in front of the automatic door 70 (S24). In a case where the opening/closing controller 92 determines that no second person has been sensed (NO in S24), the opening/closing controller 92 outputs, to the door driver 93, a door closing command for making the automatic door 70 be in a closed state (S25). The automatic door 70 is thus closed. After that, the flow proceeds back to the process in S1. In contrast, in a case where the opening/closing controller 92 determines that a second person has been sensed (YES in S24), the flow proceeds back to the process as S24.

In a case of YES in S5, in a case where the opening/closing controller 92 determines that no person standing in front of the automatic door 70 has been sensed (NO in S22), the opening/closing controller 92 determines whether or not a certain prescribed length of time has passed since the LEDs 15 lighted up (S26). In a case where the certain prescribed length of time has not passed yet (NO in S26), the flow proceeds back to S22. In contrast, in a case where the certain prescribed length of time has already passed (YES in S26), the LEDs 15 go out, and the flow proceeds back to the process in S1.

Note that after the opening of the automatic door 70 in S23, an extra process may be added to make the opening/closing controller 92 determine whether or not a certain prescribed length of time has passed since the automatic door 70 was opened. The loop processes in S24 may be performed after the certain length of time has passed. In this case, the certain prescribed length of time until the process in S25 is performed may vary depending upon the identification information registered in the NFC card 100 (e.g., the card owner is an elderly person, a wheelchair user, or the like).

Major Effect

The automatic door system 3 of the present embodiment has similar effects to those obtained by the above-described showcase 2.

Modified Example

Figure 14:
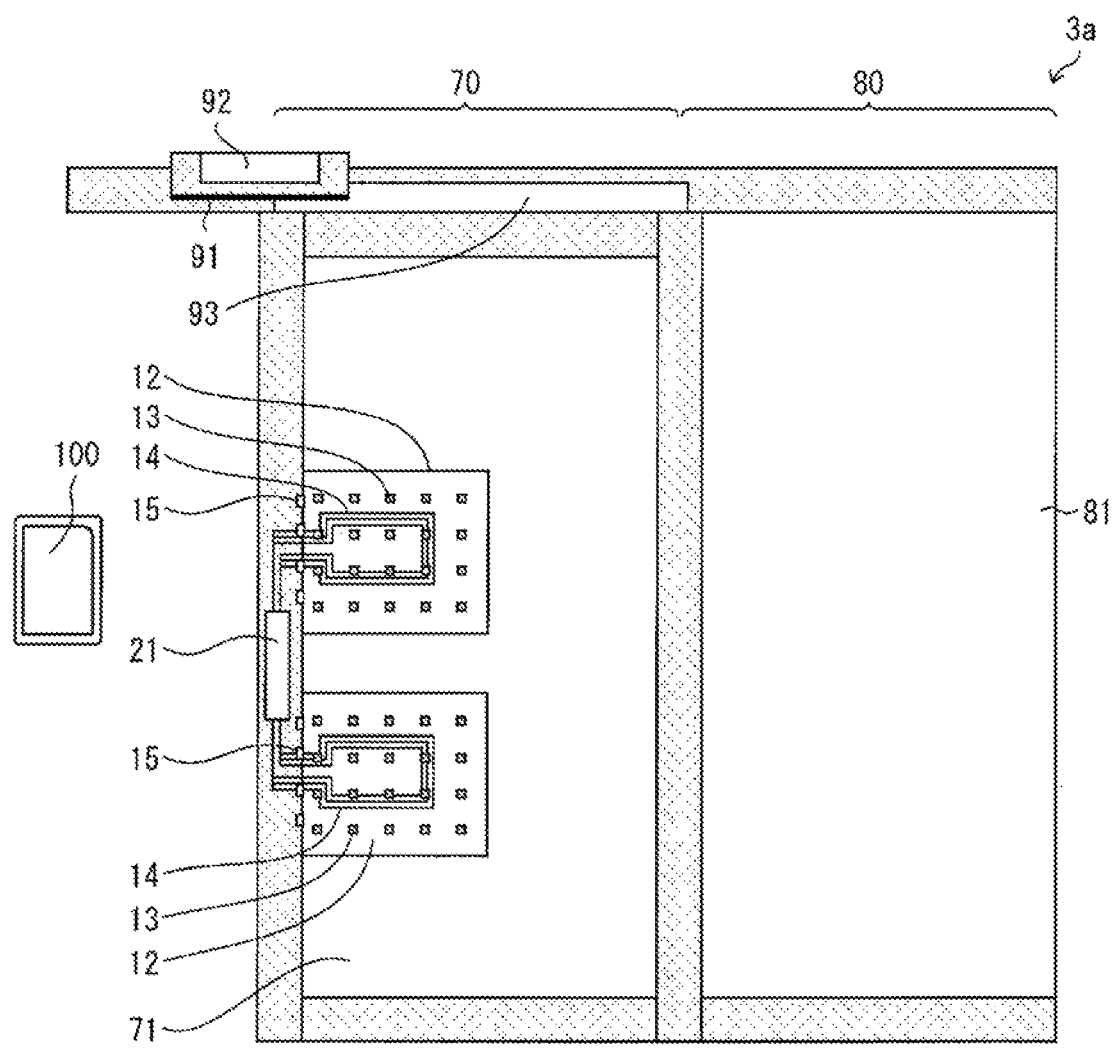
FIG. 14 is a drawing illustrating an external appearance of an automatic door system of a modified example of the third embodiment.

An automatic door system 3a is a modified example of the automatic door system 3 in the third embodiment. The automatic door system 3a will be described below with reference to FIG. 14. FIG. 14 is a drawing illustrating an external appearance of the automatic door system 3a of this modified example. As illustrated in FIG. 14, the automatic door system 3a differs from the automatic door system 3 in that the former includes two light guide plates 12 (transparent panels 10) each of which is equipped with an NFC antenna 14 and the like.

In the automatic door system 3a, for instance, a first one of the two light guide plates 12 may be disposed at a higher position (at a height that allows an adult to easily hold his/her NFC card 100 over the first light guide plate 12) and a second one thereof may be disposed at a lower position (a height that allows a child, a wheel chair user, or the like to easily hold his/her NFC card 100 over the second light guide plate 12). In this case, the automatic door system 3a may be easier to use for many users than the automatic door system 3.

In addition, in a case where the NFC card 100 is held over the NFC antenna 14 at the lower position, the automatic door 70 may be kept open for a longer time than in cases where the NFC card 100 is held over the NFC antenna 14 at the higher position. As described above, a conceivable person who holds his/her NFC card over the NFC antenna 14 at the lower position is a child, a wheelchair user, or the like who needs special attention to his/her safety. In addition, the color of the light emitted from the LEDs 15, the sound outputted from the speaker 22, or the like may be varied between a case where the NFC card 100 is held over the NFC antenna 14 at the lower position and a case where the NFC card 100 is held over the NFC antenna 14 at the higher position.

The installation positions of and the number of light guide plates 12 each of which is equipped with an NFC antenna 14 are not limited to their respective examples described above. Various installation forms are conceivable depending upon the place where the automatic door system 3a is installed, the users who are supposed to use the automatic door system 3a, or the like.

Fourth Embodiment

Hereinafter, the fourth embodiment according to an aspect of the present invention will be described with reference to FIG. 15A to FIG. 16. Note that, for convenience of description, components illustrated in respective embodiments are designated by the same reference numerals as those having the same function, and the descriptions of these components will be omitted.

Configuration of Transparent Panel 10a

Figure 15A:
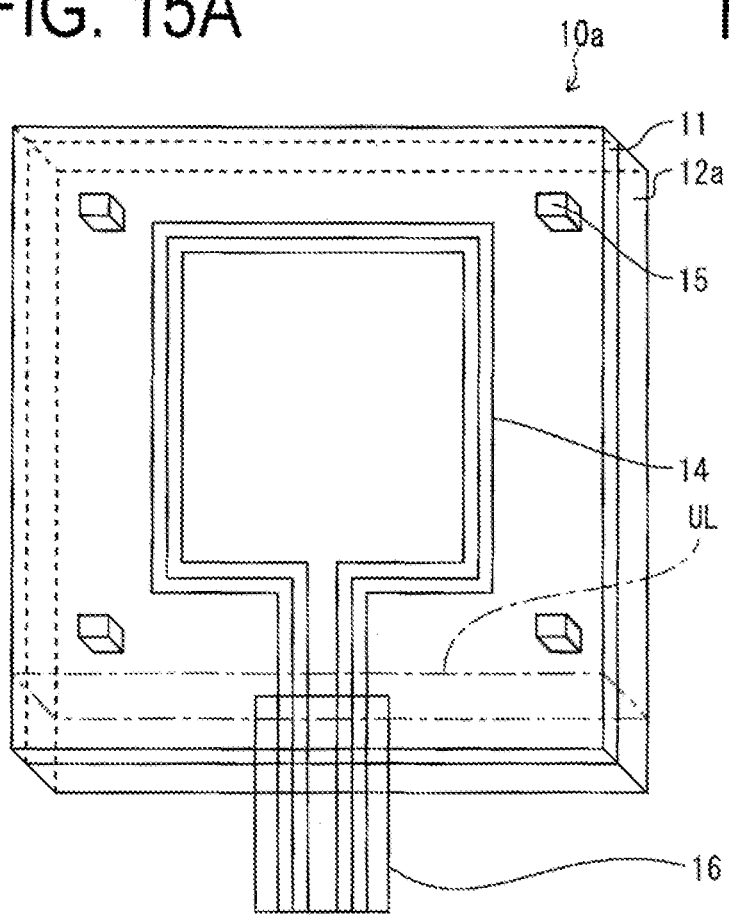
FIGS. 15A and 15B illustrate drawings illustrating a configuration of a transparent panel of a fourth embodiment.
Figure 15A:
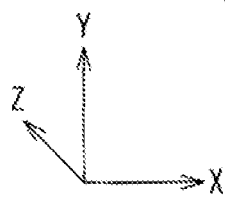
Figure 15B:
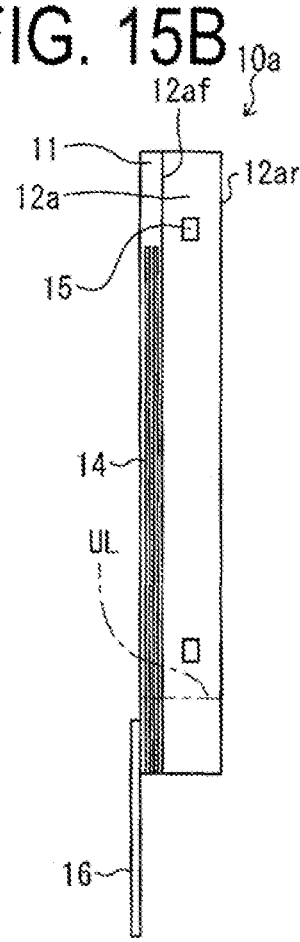
Figure 15B:
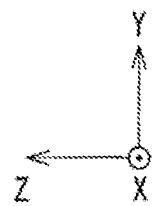

FIGS. 15A and 15B are drawings illustrating a configuration of a transparent panel 10a of the present embodiment. FIG. 15A is a perspective view, and FIG. 15B is a side view. As illustrated in FIGS. 15A and 15B, the transparent panel 10a differs from the transparent panel 10 in that the transparent panel 10a includes a transparent plate 12a instead of the light guide plate 12.

The transparent plate 12a is a transparent plate-shaped member. The material for the transparent plate 12a is not particularly limited to a specific material as long as the material is a transparent material such as glass and synthetic resin (e.g., polycarbonate resins and methacrylic resins).

The LEDs 15 are buried in the transparent plate 12a. In the example illustrated in FIG. 15A, four LEDs 15 are disposed in every corner of the transparent plate 12a. The position and the number of LEDs 15, however, are not particularly limited to those described above. Nevertheless, to prevent the central portion of the transparent plate 12a from having a lowered transparency, the LEDs 15 may preferably be disposed in edge portions of the transparent plate 12a.

The NFC antenna sheet 11 including the NFC antenna 14 is disposed on the principal surface 12af (first surface) of the transparent plate 12a. The flexible board 16 is connected to a lower portion of the NFC antenna 14 (below the one-dot dash line UL illustrated in FIGS. 15A and 15B). The lower portion of the NFC antenna 14 and the flexible board 16 are housed inside of a base (not illustrated).

The transparent panel 10a may be applied to the swing door 40 or the automatic door 70 in the embodiments described above. In addition, the lighting-up control for the LEDs 15 may be similar to the lighting-up controls in the first embodiment to the third embodiment 3 described above.

Figure 16:
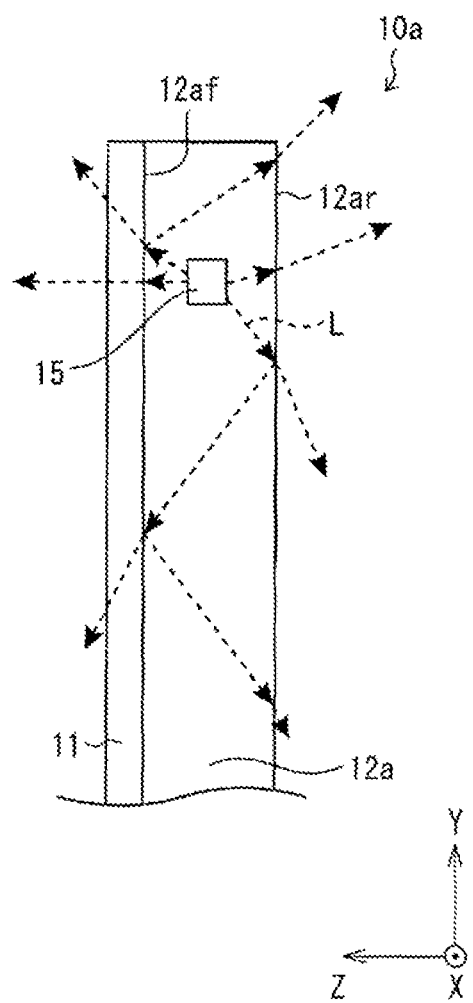
FIG. 16 is a cross-sectional view illustrating light propagation paths in a transparent plate.

FIG. 16 is a cross-sectional view illustrating propagation paths of light L in the transparent plate 12a. As illustrated in FIG. 16, some part of the light L emitted from the LEDs 15 buried in the transparent plate 12a is propagated within the transparent plate 12a and exits out of the transparent plate 12a as indicated by the broken-line arrows in FIG. 16. Hence, the transparent plate 12a may also be considered as a light guide.

No recess 13 is formed in the transparent plate 12a. Hence, in a case where the presence of the NFC antenna sheet 11 is not taken into consideration, the intensity of the light L exiting through the principal surface 12af is substantially the same as the intensity of the light L exiting through the backside 12ar (second surface).

Implementation Example by Software

The light-emitting device 1 and the control blocks of the authentication device 50 (especially, the ID acquiring unit 231, the ID collating units 232, and the output-mode identifying units 233) may be implemented by a logic circuit (hardware) formed in an integrated circuit (IC chip) and the like, or may be implemented by a software program using a Central Processing Unit (CPU).

In the latter configuration, the light-emitting device 1 and authentication device 50 each include a CPU for executing instructions of a program which is software for implementing each function, a Read Only Memory (ROM) or a storage device (each of these is referred to as a "recording medium") in which the program and various types of data are recorded in a computer-readable (or CPU-readable) manner, a Random Access Memory (RAM) in which the program is loaded, and the like. Then, the computer (or CPU) reads the program from the recording medium and executes the program to achieve the object of the present invention. As the recording medium, a "non-transitory tangible medium", such as a tape, a disk, a card, a semiconductor memory, and a programmable logic circuit may be used. Further, the program may be supplied to the computer via any transmission medium (a communication network, a broadcast wave, or the like) able to transmit the program. Note that the present invention may be implemented in a form of data signal embedded in a carrier wave, which is embodied by electronic transmission of the program.

Supplement

A light-emitting device according to Aspect 1 of the present invention includes: a light source; a light guide configured to guide light emitted from the light source; and an antenna layer having transparency and provided on a first surface of the light guide, the first surface being a principal surface of the light guide, or provided on a second surface that is opposite to the first surface, wherein at least some part of light guided by the light guide exits out through the first surface, and the light source is configured to emit light on the basis of information obtained through communications via the antenna layer.

With this configuration, the light emitted from the light source is guided by the light guide, and the light thus guided is allowed to exit to the outside. Allowing the light guide to emit light rather than allowing the light source to singularly emit light increases the area of the light-emitting surface, which allows the user to visually recognize the light emission more easily. In addition, the transparent antenna layer is provided as an antenna for communications. Hence, even in a case where the antenna is disposed on a surface of the light guide (either on the first surface or on the second surface), the light emission from the light guide is prevented from becoming less visible.

A light-emitting device according to Aspect 2 of the present invention is the light-emitting device according to Aspect 1, wherein in the light guide, at least a portion of the first surface of the light guide and at least a portion of the second surface of the light guide may preferably be opened to an external space and allow a user to visually recognize light emission from the first surface and from the second surface.

With this configuration, the light emission may be recognized visually by both a user positioned closer to the first surface of the light guide and a user positioned closer to the second surface of the light guide. Even in a case where only a single user is present, the user may visually recognize the light emission from both direction of the light guide. Hence, a higher viewability of the light emission is achieved.

A light-emitting device according to Aspect 3 of the present invention is the light-emitting device according to Aspect 1 or 2, wherein the light guide may preferably have transparency to allow light that enters from outside through the second surface to exit through the first surface.

With this configuration, an object that exist on the opposite side of the light guide from the viewer is visually recognizable.

An authentication notification system according to Aspect 4 of the present invention includes: the light-emitting device according to any one of Aspects 1 to 3; and an authentication circuitry configured to perform authentication by use of identification information received via the antenna layer, wherein the light source emits light on the basis of a result of the authentication performed by the authentication circuitry.

With this configuration, the user may be notified, by the light emission of the light guide, of the result of authentication performed by the authentication circuitry.

A door according to Aspect 5 of the present invention includes the light-emitting device according to any one of Aspects 1 to 3 in at least a portion of the door.

With this configuration, the light guide incorporated in the door as at least a part of the door is made to emit light. Hence, a notification based on information obtained through communications via the transparent antenna layer may be made to the user who uses the door.

A door according to Aspect 6 of the present invention is the door according to Aspect 5 that is configured to communicate with an authentication device configured to perform authentication by use of identification information received via the antenna layer, and the light source is configured to emit light on the basis of a result of authentication performed by the authentication device.

With this configuration, by making the light guide incorporated in the door emit light, the user who uses the door may be notified of the authentication result.

The present invention is not limited to each of the above-described embodiments. It is possible to make various modifications within the scope of the claims. An embodiment obtained by appropriately combining technical elements each disclosed in different embodiments falls also within the technical scope of the present invention. Furthermore, technical elements disclosed in the respective embodiments may be combined to provide a new technical feature.

CROSS-REFERENCE TO RELATED APPLICATIONS

This application claims the benefit of priority to Japanese Patent Application Number 2016-114841, filed on Jun. 8, 2016. The entire contents of the above-identified application are hereby incorporated by reference.

REFERENCE SIGNS LIST

1 Light-emitting device
2 Showcase (authentication notification system)
3 Automatic door system (authentication notification system)
11 NFC antenna sheet (antenna layer)
12 Light guide plate (light guide)
12a Transparent plate (light guide)
12f Principal surface (first surface)
12af Principal surface (first surface)
12r Backside surface (second surface)
12ar Backside surface (second surface)
14 NFC antenna (antenna layer)
15 LED (light source)
40 Swing door (door)
70 Automatic door (door)
232 ID collating unit (authentication circuitry)

The invention claimed is:

1. A light-emitting device comprising:
a light source;
a light guide configured to guide light emitted from the light source; and
an antenna layer having transparency and provided on a first surface of the light guide, the first surface being a principal surface of the light guide, or provided on a second surface that is opposite to the first surface,
wherein at least some part of light guided by the light guide exits out through the first surface, and the light source is configured to emit light on the basis of information obtained through communications via the antenna layer.

2. The light-emitting device according to claim 1, wherein in the light guide, at least a portion of the first surface of the light guide and at least a portion of the second surface of the light guide are opened to an external space and allow a user to visually recognize light emission from the first surface and from the second surface.

3. The light-emitting device according to claim 2, wherein the light guide has transparency to allow light that enters from outside through the second surface to exit through the first surface.

4. An authentication notification system comprising:
the light-emitting device according to claim 3; and
an authentication circuitry configured to perform authentication by use of identification information received via the antenna layer,
wherein the light source is configured to emit light on the basis of a result of authentication performed by the authentication circuitry.

5. A door comprising the light-emitting device according to claim 3 disposed in at least a portion of the door.

6. The door according to claim 5,
wherein the door is configured to communicate with an authentication device configured to perform authentication by use of identification information received via the antenna layer, and
the light source is configured to emit light on the basis of a result of authentication performed by the authentication device.

7. An authentication notification system comprising:
the light-emitting device according to claim 2; and
an authentication circuitry configured to perform authentication by use of identification information received via the antenna layer,
wherein the light source is configured to emit light on the basis of a result of authentication performed by the authentication circuitry.

8. A door comprising the light-emitting device according to claim 2 disposed in at least a portion of the door.

9. The door according to claim 8,
wherein the door is configured to communicate with an authentication device configured to perform authentication by use of identification information received via the antenna layer, and
the light source is configured to emit light on the basis of a result of authentication performed by the authentication device.

10. The light-emitting device according to claim 1,
wherein the light guide has transparency to allow light that enters from outside through the second surface to exit through the first surface.

11. An authentication notification system comprising:
the light-emitting device according to claim 10; and
an authentication circuitry configured to perform authentication by use of identification information received via the antenna layer,
wherein the light source is configured to emit light on the basis of a result of authentication performed by the authentication circuitry.

12. A door comprising the light-emitting device according to claim 10 disposed in at least a portion of the door.

13. The door according to claim 12,
wherein the door is configured to communicate with an authentication device configured to perform authentication by use of identification information received via the antenna layer, and
the light source is configured to emit light on the basis of a result of authentication performed by the authentication device.

14. An authentication notification system comprising:
the light-emitting device according to claim 1; and
an authentication circuitry configured to perform authentication by use of identification information received via the antenna layer,
wherein the light source is configured to emit light on the basis of a result of authentication performed by the authentication circuitry.

15. A door comprising the light-emitting device according to claim 1 disposed in at least a portion of the door.

16. The door according to claim 15,
wherein the door is configured to communicate with an authentication device configured to perform authentication by use of identification information received via the antenna layer, and
the light source is configured to emit light on the basis of a result of authentication performed by the authentication device.

* * * * *